(12) United States Patent
Choi et al.

(10) Patent No.: US 9,797,038 B2
(45) Date of Patent: Oct. 24, 2017

(54) ORGANIC MATERIAL DEPOSITION APPARATUS, AND ORGANIC MATERIAL DEPOSITION METHOD USING SAME

(71) Applicant: SUNIC SYSTEM, LTD., Gyeonggi-do (KR)

(72) Inventors: Chang Sik Choi, Gyeonggi-do (KR); Young Im, Seoul (KR); Young Jong Lee, Gyeonggi-do (KR); Seong Ho Kim, Gyeonggi-do (KR); Sun Hyuk Kim, Seoul (KR); Jung Gyun Lee, Gyeonggi-do (KR); In Ho Hwang, Gyeonggi-do (KR)

(73) Assignee: SUNIC SYSTEMS, LTD., Gyeonggi-Do (KR)

( * ) Notice: Subject to any disclaimer, the term of this patent is extended or adjusted under 35 U.S.C. 154(b) by 151 days.

(21) Appl. No.: 14/420,349

(22) PCT Filed: Mar. 26, 2013

(86) PCT No.: PCT/KR2013/002491
§ 371 (c)(1),
(2) Date: Feb. 6, 2015

(87) PCT Pub. No.: WO2014/025113
PCT Pub. Date: Feb. 13, 2014

(65) Prior Publication Data
US 2015/0203957 A1 Jul. 23, 2015

(30) Foreign Application Priority Data

| | | |
|---|---|---|
| Aug. 6, 2012 | (KR) | 10-2012-0085924 |
| Aug. 6, 2012 | (KR) | 10-2012-0085925 |
| Mar. 12, 2013 | (KR) | 10-2013-0026196 |

(51) Int. Cl.
*C23C 14/12* (2006.01)
*C23C 14/24* (2006.01)
(Continued)

(52) U.S. Cl.
CPC .............. *C23C 14/12* (2013.01); *C23C 14/24* (2013.01); *C23C 14/50* (2013.01); *C23C 14/56* (2013.01);
(Continued)

(58) Field of Classification Search
CPC .. H01L 51/0002; H01L 51/0011; C23C 14/56
See application file for complete search history.

(56) References Cited

U.S. PATENT DOCUMENTS

2010/0279021 A1* 11/2010 Park ..................... B05D 1/02
427/427.3

FOREIGN PATENT DOCUMENTS

| JP | 2004-052113 A | 2/2004 |
|---|---|---|
| KR | 10-0637896 B1 | 10/2006 |

(Continued)

OTHER PUBLICATIONS

International Search Report for PCT/KR2013/002491.

*Primary Examiner* — Caleb Henry
*Assistant Examiner* — Mounir Amer
(74) *Attorney, Agent, or Firm* — Sughrue Mion, PLLC

(57) ABSTRACT

An apparatus for depositing an organic material includes: a main chamber; a first substrate loading section in which a first substrate is loaded in the first radial direction and seated; a second substrate loading section in which a second substrate is loaded in the second radial direction and seated; a scanner including a linear organic material deposition source, a source moving means to which the organic material deposition source is coupled to linearly move the organic material deposition source so that the organic material
(Continued)

particles are injected onto the surface of the first substrate or the second substrate, and a rotating means for rotating the source moving means; and a scanner moving means for moving the scanner back and forth so that the scanner is positioned in the first deposition region or the second deposition region.

23 Claims, 25 Drawing Sheets

(51) Int. Cl.
    *C23C 14/50*     (2006.01)
    *H01L 51/56*     (2006.01)
    *C23C 14/56*     (2006.01)
    *H01L 51/00*     (2006.01)

(52) U.S. Cl.
    CPC ........ *H01L 51/001* (2013.01); *H01L 51/0002* (2013.01); *H01L 51/0011* (2013.01); *H01L 51/56* (2013.01)

(56) References Cited

FOREIGN PATENT DOCUMENTS

| KR | 10-2010-0120081 A | 11/2010 |
| KR | 10-2011-0124429 A | 11/2011 |

\* cited by examiner

ORGANIC MATERIAL DEPOSITION APPARATUS, AND ORGANIC MATERIAL DEPOSITION METHOD USING SAME

CROSS REFERENCE TO RELATED APPLICATIONS AND CLAIM OF PRIORITY

This patent application is a National Phase application under 35 U.S.C. §371 of International Application No. PCT/KR2013/002491, filed 26 Mar. 2013, which claims priority to Korean Patent Application Nos. 10-2012-0085924, filed 6 Aug. 2012, 10-2012-0085925, filed 6 Aug. 2012, and 10-2013-0026196, filed 12 Mar. 2013, entire contents of which are incorporated herein by reference.

TECHNICAL FIELD

The present invention relates to an apparatus for depositing an organic material, and a method for depositing the organic material using the same. More particularly, the present invention relates to an apparatus for depositing an organic material which is capable of reducing a tact time by progressing a transport process or an alignment process of another substrate during a deposition process of one substrate when performing a deposition process of a plurality of substrates within one chamber, and is capable of reducing the loss of organic material which occurs during the transport process and alignment process of the substrate, and a method for depositing the organic material using the same.

BACKGROUND ART

An organic luminescence emitting apparatus (OLED) is a self-luminous element which emits light by itself using the electroluminescent phenomenon that emits light when a current flows through the fluorescent organic compound, and since such a apparatus does not require a backlight for applying light to a non-light emitting element, it is possible to produce a light and thin flat panel display.

Since the flat panel display using such an organic electroluminescent apparatus has fast response speed and wide viewing angle, it stands out as a next generation display.

In particular, since the manufacturing process is simple, there is an advantage that is capable of significantly reducing the production cost compared to the conventional liquid crystal display.

In the organic electroluminescent apparatus, a hole injection layer, a hole transport layer, a light-emitting layer, an electron transport layer, an electron injection layer or the like as the remaining constituent layers except anode and cathode electrodes is formed of an organic thin film, and such an organic thin film is deposited on the substrate by a vacuum thermal deposition method.

The vacuum thermal deposition method is performed in a manner of transporting the substrate into a vacuum chamber, aligning a shadow mask formed with a predetermined pattern on the transported substrate, and thereafter, depositing the organic material sublimed from the crucible onto the substrate by applying heat to a crucible that contains organic material.

In the vacuum thermal deposition method according to the prior art, since the deposition process of one substrate in a chamber is performed, there has been a problem in which the deposition process of the substrate is interrupted during the transport process of the substrate and the shadow mask alignment process, and the tact time increases.

Also, since the organic material is continuously sublimated from the crucible during the transport process of the substrate and the shadow mask alignment process, there is a problem of loss of the organic material.

SUMMARY

The present invention provides an apparatus for depositing an organic material which is capable of reducing a tact time by progressing a transport process or an alignment process of another substrate during a deposition process of one substrate when performing a deposition process of a plurality of substrates within one chamber, and is capable of reducing the loss of organic material which occurs during the transport process and the alignment process of the substrate, and a method for depositing the organic material using the same.

According to a first aspect of the present invention, there is provided a apparatus for depositing organic material which includes a main chamber which is partitioned into a first deposition region and a second deposition region, through which a first substrate is put into and taken out of the first deposition region from one central point in a first radial direction, and through which a second substrate is put into and taken out of the second deposition region from the central point in a second radial direction; a first substrate loading section in which the first substrate is loaded in the first radial direction and seated; a second substrate loading section in which the second substrate is loaded in the second radial direction and seated; a scanner which includes a linear organic material deposition source for injecting the organic material particles, a source moving means to which the organic material deposition source is coupled to linearly move the organic material deposition source along the surface of the first substrate or the second substrate so that the organic material particles are injected into the surface of the first substrate or the second substrate, and a rotating means for rotating the source moving means so that the linear organic material deposition source is parallel to one side of the first substrate or the second substrate; and a scanner moving means for moving the scanner back and forth so that the scanner is positioned in the first deposition region or the second deposition region.

The source moving means may include a moving table which is disposed parallel to the substrate as being rotated by the rotating means; and a source guide section which is disposed at the moving table in a longitudinal direction so that the organic material deposition source is coupled to move in the longitudinal direction of the moving table.

The scanner moving means may include a pair of scanner guide sections which are arranged in parallel to each other across the first deposition region and the second deposition region and on which both ends of the moving table are supported, respectively. The rotating means may include a rotation guide section which is coupled to one of the pair of scanner guide sections to guide the rotation of the moving table; and a moving section which is coupled to the remaining one of the pair of scanner guide sections and to which the moving table is rotatably coupled.

The organic material deposition apparatus may further include a blocking plate which is disposed to face the surface of the first substrate or the second substrate to cover the first substrate or the second substrate.

Also, the apparatus may further include a partition wall which is coupled within the main chamber and is positioned between the first substrate loading section and the second substrate loading section.

Furthermore, according to a second aspect of the present invention, there is provided a method for depositing an organic material using the organic material deposition apparatus, the apparatus including: loading the first substrate in the first radial direction so as to be seated on the first substrate loading section; moving the scanner to a first deposition region by the scanner moving means; rotating the source moving means by the rotating means of the scanner so that the linear organic material deposition source is parallel to one side of the first substrate; linearly moving the organic material deposition source by the source moving means to deposit the organic material particles on the first substrate; loading the second substrate in the second radial direction simultaneously with depositing the organic material particles on the first substrate so as to be seated on the second substrate loading section; moving the scanner to the second deposition region by the scanner moving means when deposition of the first substrate is completed; rotating the source moving means by the rotating means of the scanner so that the linear organic material deposition source is parallel with one side of the second substrate; and linearly moving the organic material deposition source by the source moving means to deposit the organic material particles on the second substrate.

The method may further include, after depositing the organic material particles on the first substrate, taking out the deposited first substrate from the main chamber, and loading a new first substrate in the first radial direction to be seated on the first substrate loading section.

Further, the method may include, after depositing the organic material particles on the second substrate, taking out the deposited second substrate from the main chamber, and loading a new second substrate in the second radial direction to be seated on the second substrate loading section.

According to a third aspect of the present invention, there is provided a apparatus for depositing organic material which includes a main chamber which is partitioned into a first deposition region and a second deposition region, through which a first substrate is put into and taken out of the first deposition region from one central point in a first radial direction, and through which a second substrate is put into and taken out of the second deposition region from the central point in a second radial direction; a first substrate loading section and a second substrate loading section in which the first substrate and the second substrate are loaded and seated to each rotate the first substrate and the second substrate so that one side is parallel to an imaginary movement line segment which connects two arbitrary points of each of a first imaginary radial line segment formed by the first radial direction and a second imaginary line segment formed by the second radial direction; and an organic material deposition source which is disposed within the main chamber, is moved along the movement line segment so as to be positioned in the first deposition region or the second deposition region, and is moved in a direction perpendicular to the line segment to inject the organic material particles on the surface of the first substrate or the second substrate.

The organic material deposition apparatus may further include a source chamber which is coupled to one side of the main chamber is opened and closed to the main chamber each other, and through which the organic material deposition source is put into and taken out.

Also, the apparatus may further include a vacuum pump which is connected to the source chamber and removes gas in the source chamber to have the same degree of vacuum as that of the main chamber.

Two organic material deposition sources may form a set, and the pair of organic material deposition sources may be arranged alternately each other in the main chamber and the source chamber.

The apparatus may further include a blocking plate which is disposed to face the first substrate or the second substrate, and moves in a direction opposite to the organic material deposition source that moves along the movement line segment to cover the first substrate or the second substrate.

The apparatus may further include a partition wall which is coupled within the main chamber to partition the first deposition region and the second deposition region.

The organic material deposition source may further include an organic material guide which is coupled to the outer wall of the organic material deposition source so as to slide in the direction of the first substrate or the second substrate, and guides the organic material particles to the opposite first substrate or the second substrate.

According to a fourth aspect of the present invention, there is provided a method for depositing an organic material in a main chamber which is partitioned into a first deposition region where a first substrate is put into and taken out of one central point in a first radial direction and a second deposition region where a second substrate is put into and taken out of the central point in a second radial direction, the method including: a first substrate input process of putting the first substrate into the first deposition region of the main chamber in the first radial direction; a first substrate rotating process of rotating the first substrate so that one side is parallel to an imaginary movement line segment which connects two arbitrary points of each of a first imaginary radial line segment formed by the first radial direction and a second imaginary radial line segment formed by the second radial direction; a first substrate deposition process of moving the organic material deposition source along the movement line segment so as to be positioned in the first deposition region and moving it in a direction perpendicular to the movement line segment to deposit the organic material particles on the first substrate; a second substrate input process of putting the second substrate into the second deposition region of the main chamber in the second radial direction simultaneously with the first substrate deposition process; a second substrate rotating process of rotating the second substrate so that one side is parallel to the movement line segment; and a second substrate deposition process of moving the organic material deposition source along the movement line segment so as to be positioned in the second deposition region and moving it in the direction perpendicular to the movement line segment to deposit the organic material particles on the second substrate.

The method may further include, after the first substrate deposition process, a first substrate exchange process of taking the first substrate subjected to the first substrate deposition process out of the main chamber and putting a new first substrate into the first deposition region.

The method further include, after the second substrate deposition process, taking the second substrate subjected to the second substrate deposition process out of the main chamber, and putting a new second substrate into the second deposition region of the main chamber.

The two organic material deposition sources may form a set, a source chamber which is opened and closed to the main chamber each other and through which the organic material deposition source is put into and taken out may be coupled to one side of the main chamber, in this case, the method may further include a process in which the pair of organic material deposition sources is arranged alternately each other in the main chamber and the source chamber.

According to a fifth aspect of the present invention, there is provided a apparatus for depositing an organic material which includes a main chamber through which a first substrate is put into and taken out of one central point in a first radial direction and through which a second substrate is put into and taken out of the central point in a second radial direction; a first substrate loading section on which the first substrate is loaded in the first radial direction and seated; a second substrate loading section on which the second substrate is loaded in the second radial direction and seated; a linear organic material deposition source which injects the organic material particles onto the surface of the first substrate or the second substrate; a moving means for linearly moving the organic material deposition source so that the organic material particles are injected onto the surface of the first substrate or the second substrate; and rotating means for rotating the moving means so that the linear organic material deposition source is parallel to one side of the first substrate or the second substrate.

The organic material deposition apparatus may further include a source chamber which is coupled to one side of the main chamber and is opened and closed to the main chamber each other, and through which the organic material deposition source is put into and taken out.

Also, the organic material deposition apparatus may further include a vacuum pump which is connected to the source chamber and removes gas in the source chamber so as to have the same degree of vacuum as that of the main chamber.

The two organic material deposition sources may form a set, and the pair of organic material deposition sources may be disposed alternately each other in the main chamber and the source chamber.

The organic material deposition apparatus may further include a blocking plate which is disposed to face the surface of the first substrate or the second substrate and covers the first substrate or the second substrate.

The organic material deposition apparatus may include a partition wall which is coupled into the main chamber and is positioned between the first substrate loading section and the second substrate loading section.

The organic material deposition source may include an organic material guide which is coupled to an outer wall of the organic material deposition source so as to slide in the direction of the first substrate or the second substrate, and guides the organic material particles to the facing first substrate or the second substrate.

According to a sixth aspect of the present invention, there is provided a method for depositing an organic material using the organic material deposition apparatus, the method including: loading the first substrate in the first radiation direction to be seated on the first substrate loading section; rotating the moving means so that the linear organic material deposition source is parallel to one side of the first substrate; linearly moving the organic material deposition source to deposit the organic material particles on the first substrate; loading the second substrate in the second radial direction so as to be seated on the second substrate loading section simultaneously with depositing the organic material particles on the first substrate; rotating the moving means so that the linear organic material deposition source is parallel to one side of the second substrate; and linearly moving the organic material deposition source to deposit the organic material particles on the second substrate.

The method may further include, after depositing the organic material particles on the first substrate, taking out the deposited first substrate from the main chamber, and loading a new first substrate in the first radial direction so as to be seated on the first substrate loading section.

The method may further include, after depositing the organic material particles on the second substrate, taking out the deposited second substrate from the main chamber, and loading a new second substrate in the second radiation direction so as to be seated on the second substrate loading section.

The two organic material deposition sources may form a set, a source chamber, which is opened and closed to the main chamber each other and through which the organic material deposition source is put into and taken out, may be coupled to one side of the main chamber, and in this case, the method may further include a process in which pair of the organic material deposition sources is arranged alternately with each other in the main chamber and the source chamber.

According to an embodiment of the present invention, when performing the deposition process of a plurality of substrates in a single chamber, by performing the transport process and the alignment process of another substrate during the deposition process of one substrate, tact time can be reduced, and it is possible to reduce the loss of organic material which occurs during the transport process and the alignment process of the substrate.

BRIEF DESCRIPTION OF THE DRAWINGS

The above objects, other features and advantages of the present invention will become more apparent by describing the preferred embodiments thereof with reference to the accompanying drawings, in which.

EMBODIMENTS OF THE INVENTION

Figure 1:
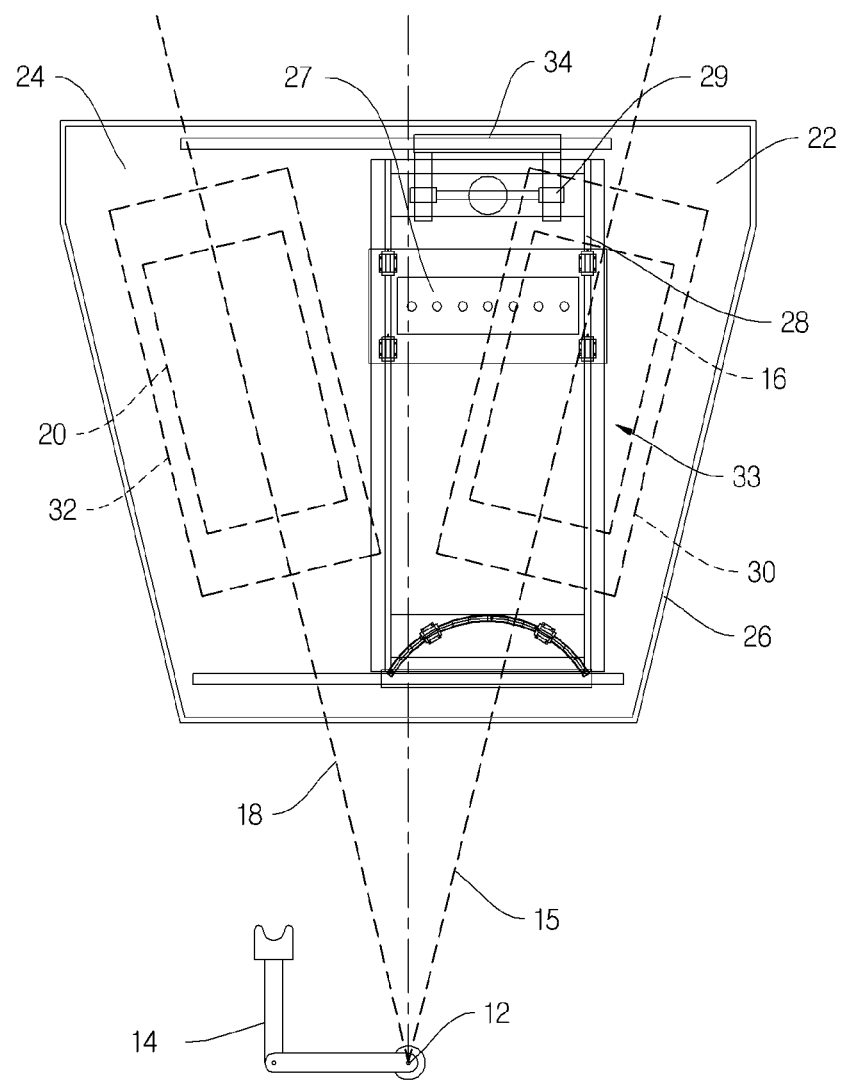
FIG. 1 is a cross-sectional view for illustrating a configuration of an organic material deposition apparatus according to a first embodiment of the present invention.

Now, embodiments of the present invention will be described in detail with reference to the accompanying drawings. The matters defined in the description, such as the detailed construction and elements, are nothing but specific details provided to assist those of ordinary skill in the art in a comprehensive understanding of the invention, and the present invention is not limited to the embodiments disclosed hereinafter.

Although the present invention may have various modifications and several embodiments, specific embodiments will be illustrated in the drawings and described in the detailed description. However, this is not intended to limit the invention to arbitrary embodiments, and it should be understood to include all modifications, equivalents or alternatives included in the spirit and scope of the present invention. In describing the present invention, when the detailed description of related well-known technology is determined to be able to obscure the subject matters of the present invention, the detailed description thereof will be omitted.

Hereinafter, embodiments of the organic material deposition apparatus and the organic material deposition method using the same according to the present invention will be described in detail with reference to the accompanying drawings, and in describing the invention with reference to the accompanying drawings, the identical or corresponding constituent elements are denoted by the same reference numerals, and the repeated descriptions thereof will not be provided.

Figure 2:
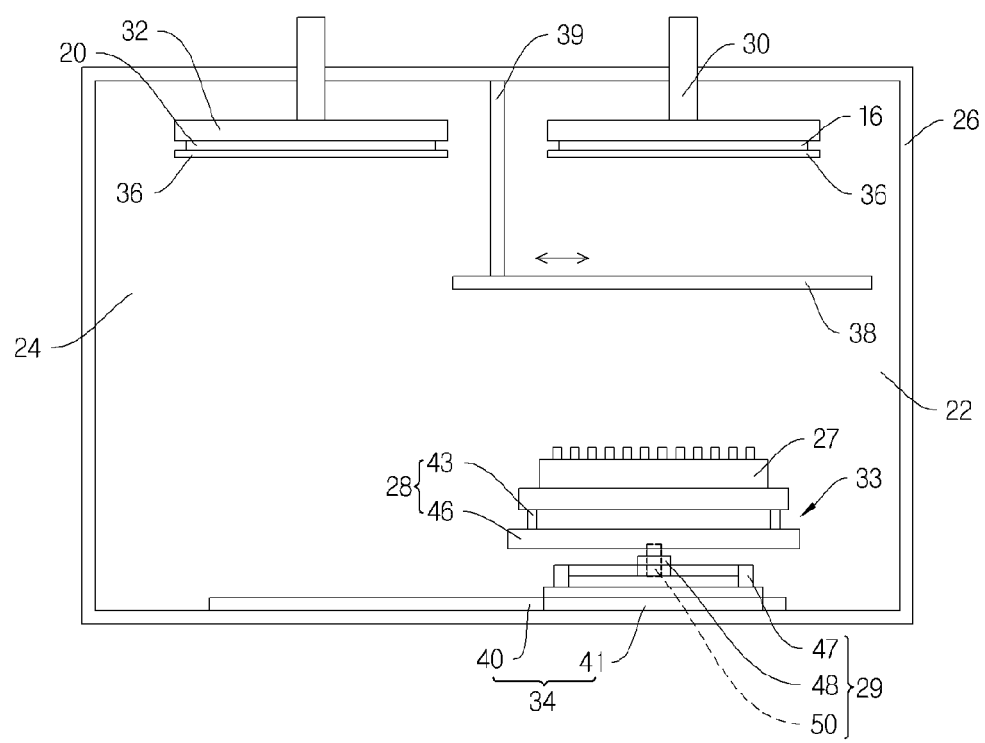
FIG. 2 is a vertical cross-sectional view for illustrating the configuration of the organic material deposition apparatus according to a first embodiment of the present invention.
Figure 3:
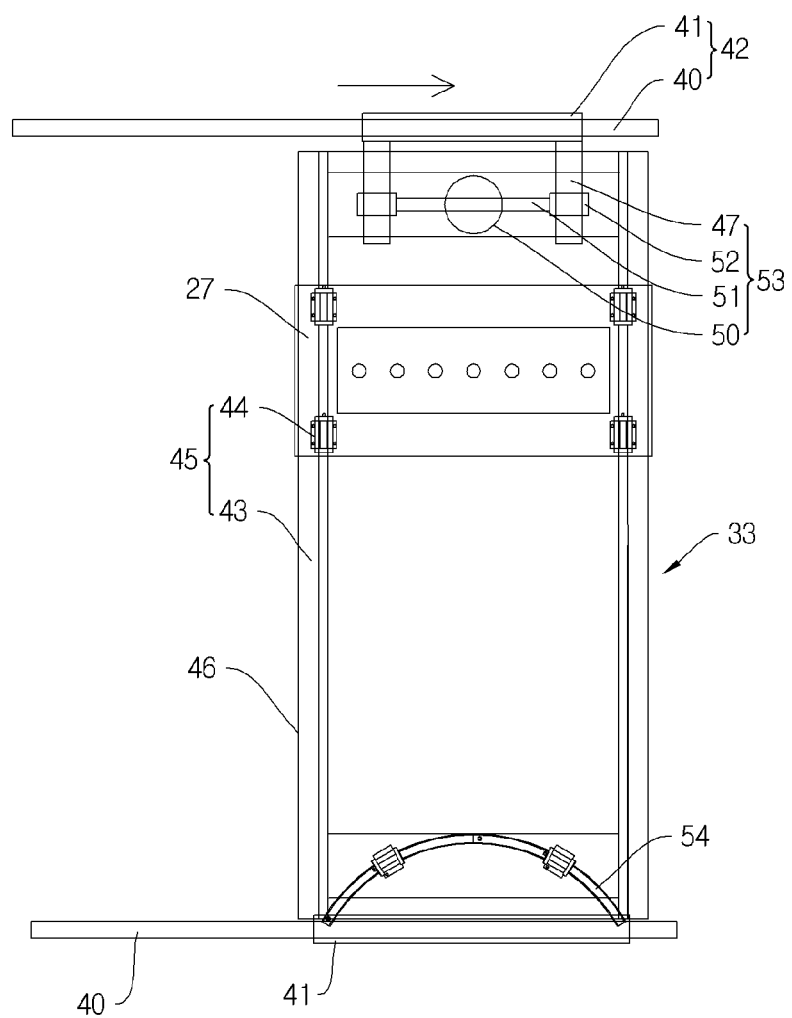
FIG. 3 is a diagram for illustrating a scanner and a scanner moving means of the organic material deposition apparatus according to a first embodiment of the present invention.

FIG. 1 is a horizontal cross-sectional view for illustrating the configuration of the organic material deposition apparatus according to a first embodiment of the present invention, FIG. 2 is a vertical cross-sectional view for illustrating the configuration of the organic material deposition apparatus according to the first embodiment of the present invention, and FIG. 3 is a diagram for illustrating a scanner and a scanner moving means of the organic material deposition source of the organic material deposition apparatus according to the first embodiment of the present invention.

FIGS. 1 to 3 illustrate a central point 12, a robot arm 14, a first radial direction 15, a first substrate 16, a second radial direction 18, a second substrate 20, a first deposition region 22, a second deposition region 24, a main chamber 126, an organic material deposition source 27, a source moving means 28, a rotating means 29, a first substrate loading section 30, a second substrate loading section 32, a scanner 33, a scanner moving means 34, a shadow mask 36, a blocking plate 38, a partition wall 39, LM guides 40, 43 and 47, moving blocks 41, 44 and 52, a scanner guide section 42, a source guide section 45, a moving table 46, a boss 48, a rotary shaft 50, a support section 51, a rotating section 53 and a rotation guide section 54.

The organic material deposition apparatus according to this embodiment includes a main chamber 126 which is partitioned into a first deposition region 22 and a second deposition region 24, through which a first substrate 16 is put into and taken out of the first deposition region 22 from one central point 12 in a first radial direction 15, and through which a second substrate 20 is put into and taken out of the second deposition region 24 from the central point 12 in a second radial direction 18; a first substrate loading section 30 in which the first substrate 16 is put into the first radial direction 15 and seated; a second substrate loading section 32 in which the second substrate 20 is loaded in the second radial direction 18 and seated; a scanner 33 which includes a linear organic material deposition source 27 for injecting the organic material particles, a source moving means 28 to which the organic material deposition source 27 is coupled to linearly move the organic material deposition source 27 along the surface of the first substrate 16 or the second substrate 20 so that the organic material particles are injected into the surface of the first substrate 16 or the second substrate 20, and a rotating means 29 for rotating the source moving means 28 so that the linear organic material deposition source 27 is parallel to one side of the first substrate 16 or the second substrate 20; and a scanner moving means 34 for moving the scanner 33 back and forth so that the scanner 33 is positioned in the first deposition region 22 or the second deposition region 24. Accordingly, when performing the deposition process of the plurality of substrates in a single chamber, it is possible to reduce the tact time by performing the transport process or the alignment process of the other substrate during the deposition process of one substrate, and it is possible to reduce the loss of organic material which occurs during the transport process or the alignment process of the substrate.

The main chamber 126 is partitioned into the first deposition region 22 and the second deposition region 24 and is configured so that the first substrate 16 is put into and taken out of the first deposition region 22 from one central point 12 in the first radial direction 15 and the second substrate 20 are put into and taken out of the second deposition region 24 from the central point 12 in the second radial direction 18.

The main chamber 126 is a place where the organic material is deposited on the substrate therein, and the interior thereof can be maintained in the vacuum state by the vacuum pump. When the organic material deposition is performed at atmospheric pressure, the interior can also be maintained under the atmospheric pressure condition. The main chamber 26 may be partitioned into a plurality of deposition regions 22, 24 so that the plurality of substrates can be deposited in one main chamber 26.

The deposition regions 22, 24 mean an imaginary space in which the organic material deposition of one substrate can be performed in accordance with the movement of the organic material deposition source 27. With reference to FIG. 1, the main chamber 26 can be partitioned into the first deposition region 22 and the second deposition region 24 by the central line of the main chamber 26 illustrated in a chain line in FIG. 1. The deposition of organic material particles of the first substrate 16 is performed in the first deposition region 22, and the deposition of organic material particles of the second substrate 20 is performed in the second deposition region 24 adjacent to the first deposition region 22.

The first substrate 16 is put into or taken out of the first deposition region 22 of the main chamber 26 from the one central point 12 in the first radial direction 15, and the second substrate 20 is put into or taken out of the second deposition region 24 of the main chamber 26 from the central point 12 in the second radial direction 18. That is, the first substrate 16 and the second substrate 20 are put into or taken out of the main chamber 26 with a constant slope.

In the deposition system of the cluster type, the substrate can be put into or taken out of the main chamber 26 by the robot arm 14 provided in the transfer chamber connected to the main chamber 26. Since the substrate is put into or taken out of the main chamber 26 from the rotation center of the robot arm 14 in the radial direction, the substrate is put into or taken out of the main chamber 26 with a constant slope.

Therefore, when the first substrate 16 and the second substrate 20 are put into or taken out of the main chamber 26 by the robot arm 14, the first substrate 16 is put into or taken out of the main chamber 26 with respect to the rotation center of the robot arm 14 forming the central point 12 in the first radial direction 15, and the second substrate 20 is put into or taken out of the main chamber 26 with respect to the rotation center of the robot arm 14 forming the central point 12 in the second radial direction 18 different from first radial direction 15.

However, without being limited to a configuration in which the first substrate 16 and the second substrate 20 are put into or taken out of the main chamber 26 by the robot arm 14, when the first substrate 16 and the second substrate 20 are put into or taken out of the main chamber 26 with a slope to each other, the organic material deposition apparatus according to the present embodiment can be applied. For example, when the first substrate 16 and the second substrate 20 are put into or taken out of the main chamber 26 by the two robot arms 14, the rotation center of the robot arm 14 does not constitute the above-mentioned central point 12, and a point, on which the two imaginary sloping lines formed by the slope direction of the first substrate 16 and the second substrate 20 meet, constitutes the central point 12.

The first substrate 16 and the second substrate 20 are loaded to and seated on the first substrate loading section 30 and the second substrate loading section 32, respectively. In this embodiment, the upper surfaces of the first substrate 16 and the second substrate 20 are each attached to the lower surfaces of the first substrate loading section 30 and the second substrate loading section 32 so that the organic material particles are injected upward from the organic material deposition source 27 and the organic material can be deposited on the substrate.

When the first substrate 16 and the second substrate 20 are each loaded to and seated on the first substrate loading section 30 and the second substrate loading section 32, the shadow mask 36 is disposed on the surface of the substrate in each of the substrate loading sections 30, 32, and the substrate and the shadow mask 36 can be aligned with one another.

The scanner 33 includes a linear organic material deposition source 27 for injecting the organic material particles, a source moving means 28 to which the organic material deposition source 27 is coupled to linearly move the organic material deposition source 27 along the surface of the first substrate 16 or the second substrate 20 on the surface so that the organic material particles are injected onto the surface of the first substrate 16 or the second substrate 20, and a rotating means 29 for rotating the source moving means 28 so that the linear organic evaporation source 27 is parallel to one side of the first substrate 16 or the second substrate 20. The scanner 33 linearly moves the organic material deposition source 27 back and forth along the surface of the substrate so that the organic material particles ejected from the organic material deposition source 27 are deposited on the surface of the substrate.

The linear organic material deposition source 27 injects the organic material particles onto the surface of the first substrate 16 or the second substrate 20. The linear organic material deposition source 27 linearly moves in the opposite other side direction from one side of the substrate to deposit the organic materials on the substrate, and is linearly configured to correspond to the width of the substrate. The deposition of the organic material to the substrate is are carried out in a manner of depositing the organic material particles sublimated from the crucible by applying heat to the crucible of the organic material evaporation source 27 that contains the organic material.

The source moving means 28 linearly moves the organic material deposition source 27 along the surface of the first substrate 16 or the second substrate 20 so that the organic material particles are injected to the surface of the first substrate 16 or the second substrate 20. As described above, since the organic material deposition source 27 linearly moves in the opposite other direction from the one side of the substrate to deposit the organic material on the substrate, the organic material deposition source 27 is linearly moved by utilizing the source moving means 28.

The scanner moving means 34 moves the scanner 33 back and forth so that the scanner 33 is positioned in the first deposition region 22 or the second deposition region 24. When the deposition of the first substrate 16 is completed, there is a need to deposit the second substrate 20, and the scanner moving means 34 moves the scanner 33 subjected to the deposition process in the first deposition region 22 to the second deposition region 24. The scanner moving means 34 causes the scanner 33 to perform the deposition process on the substrate located in each deposition region, while reciprocating between the first deposition region 22 and the second deposition region 24. In this embodiment, the scanner moving means 34 has been configured so that the scanner 33 can linearly reciprocate between the first deposition region 22 and the second deposition region 24.

FIG. 3 illustrates the scanner 33 and the scanner moving means 34 of the organic material deposition apparatus according to the first embodiment of the present invention. The source moving means 28 can be configured to include a moving table 46 disposed in parallel to the substrate as being rotated by the rotating means 29, and source guide section 45 which is disposed in the moving table 46 in the longitudinal direction so as to move in the longitudinal direction of the movable table 46 by being coupled to the organic material deposition source 27. The scanner moving means 34 are arranged in parallel with each other across the first deposition region 22 and the second deposition region 24, and include a pair of scanner guide section 42 on which both ends of the moving table 46 are each supported. The rotating means 29 includes a rotation guide section 54 which is coupled to one of the pair of the scanner guide section 42 to guide the rotation of the moving table 46, and a rotating section 53 which is coupled to the other of the pair of scanner guide sections 42 and to which the moving table 46 is rotatably coupled. Referring to FIG. 3, the pair of scanner guide sections 42 are disposed above and below the main chamber 26 in parallel with each other across the first deposition region 22 and the second deposition region 24, and the moving table 46 is coupled to the scanner guide section 42 so that both ends are supported on the pair of the scanner guide section 42, respectively. At this time, for rotation of the moving table 46, the rotation guide section 54 is interposed between the lower scanner guide section 42 and the moving table 46, and the rotating section 53, to which the moving table 46 is rotatably coupled, is coupled between the upper scanner guide section 42 and the moving table 46.

In this embodiment, the ordinary linear motor (LM) guide is used as the source guide section 45 and the scanner guide section 42.

Referring to FIG. 3, when examining the movement and rotation process of the scanner 33 for the deposition of the first substrate 16, the scanner 33 moves from the left second deposition region 24 to right first deposition region 22 along the LM guide 40 disposed above and below the main chamber 26. When the scanner 33 enters the first deposition region 22 to reach an arbitrary position, the moving block 41 of the lower LM guide 40 is stopped. The moving block 41 of the upper LM guide 40 is continuously moved in the state of stopping the movement of the moving table 46 to the lower end portion. When the movement of the moving table 46 to the upper end portion is continued, the lower end portion of the moving table 46 is rotated while the rotation is guided by the rotation guide section 54, and the moving table 46 can be rotated so as to have a slope.

The first substrate 16 is loaded to the main chamber 26 in the first radial direction 15 with a slope, and is seated on the first substrate loading section 30. In a state of rotating the source moving means 38 by the rotating means 29 so that the one side of the first substrate 16 and the longitudinal direction of the linear organic material deposition source 27 form a linear shape, the organic material deposition source 27 is linearly moved in the direction of the first substrate 16 by the source moving means 28 to deposit the organic material particles on the surface of the first substrate 16.

The rotating section 53 can be configured to include a pair of LM guides 47 which extends perpendicularly from the LM guide 40 of the upper scanner guide section 40, a support section 51 which connects the moving block 52 of the pair of LM guides 47, and a boss 48 which extends perpendicularly from the support section 51. A rotary shaft 50 protrudes from the moving table 46 and is inserted into the boss 48. Along with the movement of the upper end of the moving table 46, the rotary shaft 50 is rotated within boss 48, and the boss 48 is move up and down along the LM guide 47 of the rotating section 53 according to the rotation. The stop position of the lower end of the moving table 46 and the movement position of the upper end of the moving table 46 can be determined according to the slope of the substrate.

The blocking plate 38 is disposed to face the first substrate 16 or the second substrate 20, and moves in the opposite direction to the organic material deposition source 27 linearly moved by the scanner moving means 34, thereby covering the first substrate 16 or the second substrate 20. Referring to FIG. 2, when the organic material deposition source 27 moves to the second deposition region 24 so as to deposit the second substrate 20, the blocking plate 38 is moved in the opposite direction to cover the first substrate 16. This is in order to prevent the parasitic deposition in which the organic material particles evaporated from the organic material deposition source 27 while depositing the second substrate 20 is scattered to and deposited on the first substrate 16. Also, when the organic material deposition source 27 is moved to the first deposition region 22 so as to deposit the first substrate 16, the blocking plate 38 is moved in the opposite direction to cover the second substrate 20.

The partition wall 39 is coupled into the main chamber 26 and is located between the first substrate loading section 30 and the second substrate loading section 32. In this embodiment, although a form of forming partition wall 39 is provided so as to extend in the direction from the upper to the lower end of the main chamber 26 along the center line of the main chamber 26 illustrated by a two-dot chain line illustrated in FIG. 1, the shape and formation position of the partition wall 39 are not limited to this, and anything may be used as long as the substrate seated on one substrate loading section can be isolated from the other substrate loading section. In other words, anything may be used as long as it is possible to prevent the organic material particles from being parasitically deposited on the other substrate loading section when the organic material deposition is performed on the substrate seated on one substrate loading section. For example, when there is a standby region of the organic material deposition source 27 between the first substrate loading section 30 and the second substrate loading section 32, two partition walls 39 may exist between the first substrate loading section 30 and the standby region, and between the second substrate loading section 32 and the standby region, respectively.

In this embodiment, the partition wall 39 is formed to extend from the upper end to the lower end of the interior of the main chamber 26 at a predetermined distance, and the blocking plate 38 is disposed in the horizontal direction to the lower end of the partition wall 39. It is possible to prevent the parasitic deposition of organic material to the adjacent substrate by the partition wall 39 and the blocking plate 38.

Figure 4:
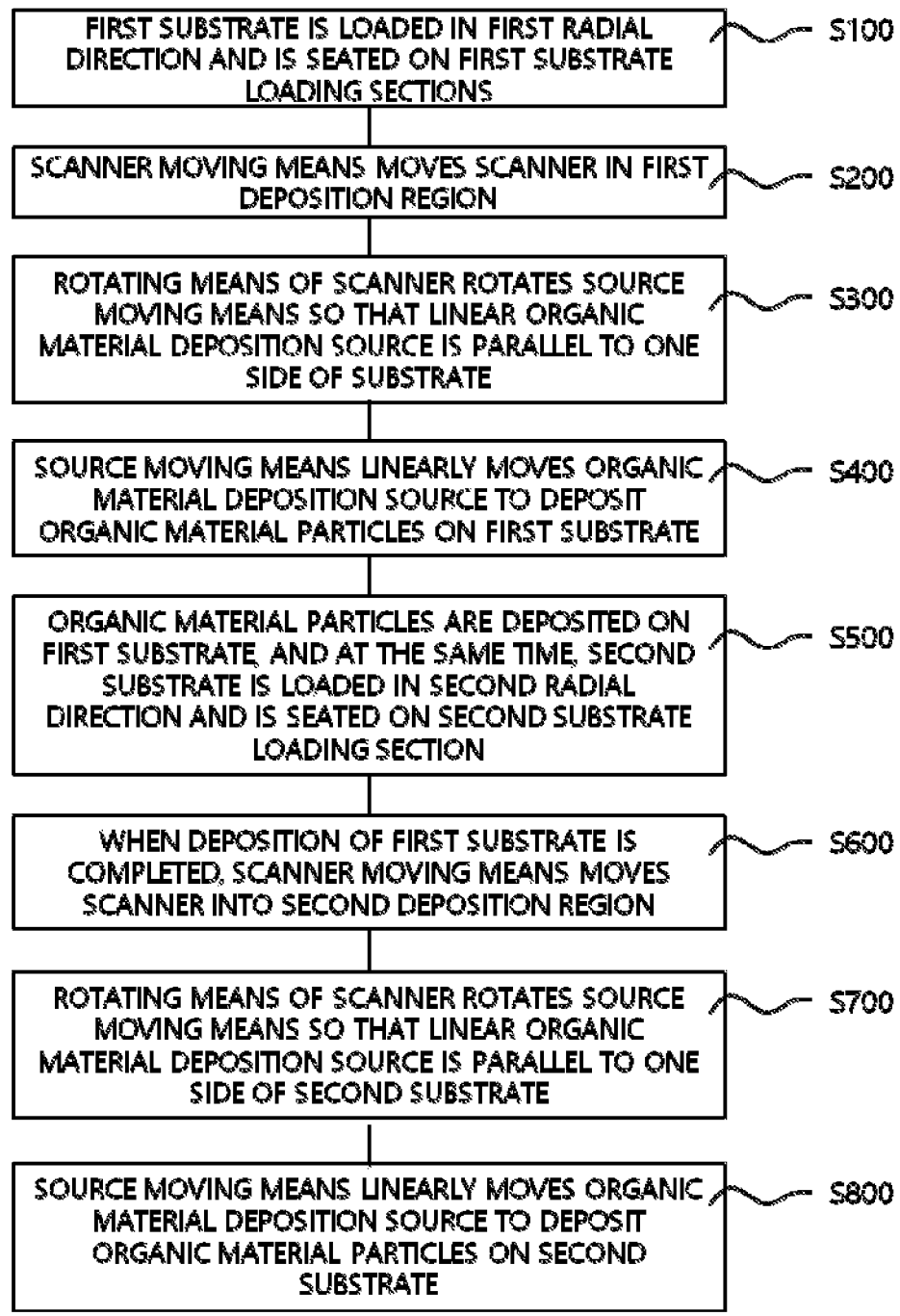
FIG. 4 is a flowchart of an organic material deposition method according to a second embodiment of the present invention.

FIG. 4 is a flow chart of an organic material deposition method according to a second embodiment of the present invention, and FIGS. 5 to 10 are flowcharts of the organic material deposition method according to the second embodiment of the present invention.

FIGS. 5 to 10 illustrate a first radial direction 15, first substrates 16, 16', a second radial direction 18, a second substrate 20, a main chamber 26, an organic material deposition source 27, a source moving means 28, a rotating means 29, a first substrate loading section 30, a second substrate loading section 32, a scanner 33 and a scanner moving means 34.

The organic material deposition method according to the present embodiment is a method for depositing an organic material using the above-described organic material deposition apparatus, the method including: loading the first substrate 16 in the first radial direction 15 so as to be seated on the first substrate loading section 30; moving the scanner 33 to a first deposition region 22 by the scanner moving means 34; rotating the source moving means 28 by the rotating means 29 of the scanner 33 so that the linear organic material deposition source 27 is parallel to one side of the first substrate 16; linearly moving the organic material deposition source 27 by the source moving means 28 to deposit the organic material particles on the first substrate 16; loading the second substrate 20 in the second radial direction 18 simultaneously with depositing the organic material particles on the first substrate 16 so as to be seated on the second substrate loading section 32; moving the scanner 33 to the second deposition region 24 by the scanner moving means 34 when deposition of the first substrate 16 is completed; rotating the source moving means 28 by the moving means 29 of the scanner 33 so that the linear organic material deposition source 27 is parallel with one side of the second substrate 20; and linearly moving the organic material deposition source 27 by the source moving means 28 to deposit the organic material particles on the second substrate 20. Thus, when performing the deposition process of the plurality of substrates in a single chamber, it is possible to reduce the tact time by performing the transport process or the alignment process of the other substrate during the deposition process of one substrate, and it is possible to reduce the loss of organic material which occurs during the transport process or the alignment process of the substrate.

The organic material deposition method according to the present embodiment relates to a method for depositing the organic material on the substrate within the main chamber 26 which is partitioned into a first deposition region 22 through which the first substrate 16 is put into or taken out of one central point 12 in the first radial direction 15, and a second deposition region 24 through which the second substrate 20 is put into or taken out of the central point 12 in the second radial direction 18. The organic material deposition is performed on the first substrate 16 in the first deposition region 22, and the organic material deposition is performed on the second substrate 20 in the second deposition region 24.

Figure 5:
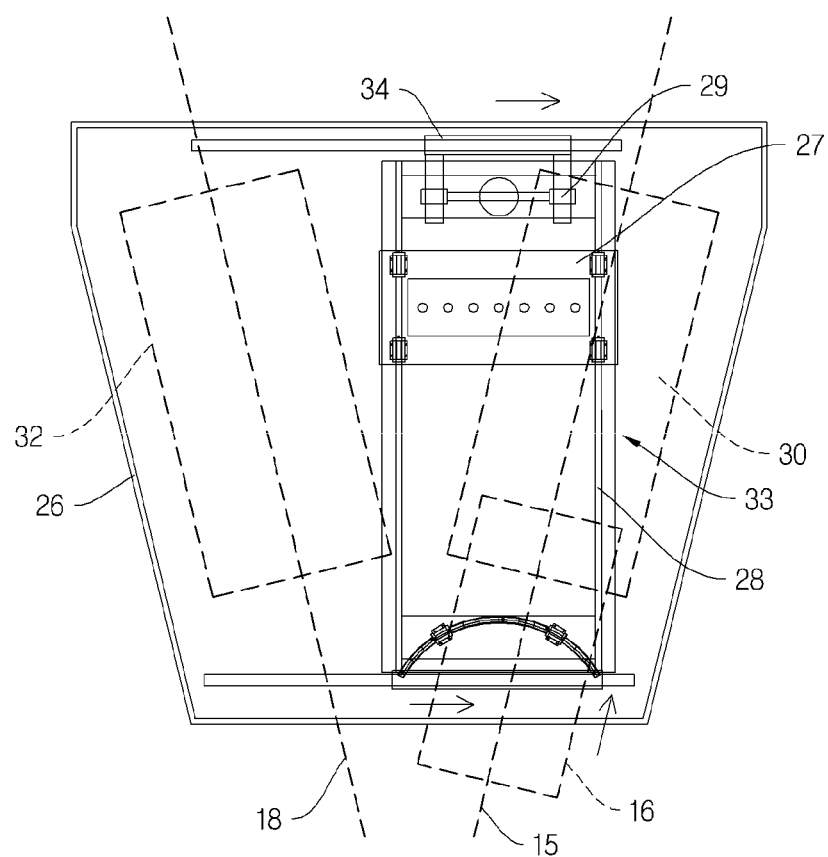
FIGS. 5 to 10 are flowcharts of the organic material deposition method according to the second embodiment of the present invention.

When examining the organic material deposition method according to the present embodiment, first, as shown in FIG. 5, the first substrate 16 is put into the first radial direction 15 and is seated on the first substrate loading section 30 (S100).

In the deposition system in the cluster type, the substrate can be put into or taken out of the main chamber 26 by the robot arm 14 provided in the transfer chamber connected to the main chamber 26. Since the substrate is put into or taken out of the main chamber 26 from the rotation center of the robot arm 14 in the radial direction, the substrate can be disposed in the main chamber 26 with a constant slope.

Therefore, when the first substrate 16 is seated on the first substrate loading section 30 of the main chamber 26 by the robot arm 14, the first substrate 16 is seated on the first substrate loading section 30 in a first radial direction 15 from the rotation center of the robot arm 14 that constitutes the central point 12.

In this process, when the first substrate 16 is seated on the first substrate loading section 30, the shadow mask is disposed on the surface of the first substrate 16, and alignment between the first substrate 16 and the shadow mask is achieved.

Then, as shown in FIG. 5, the scanner moving means 34 moves the scanner 33 in the first deposition region 22 (S200). To perform the first deposition process of the substrate 16, the scanner 33 is moved in the first deposition region 22. This example relates to a method for performing deposition on a plurality of substrates by a single organic material deposition source 27, and the scanner 33 is linearly moved back and forth between the deposition regions by the scanner moving means 34.

Figure 6:
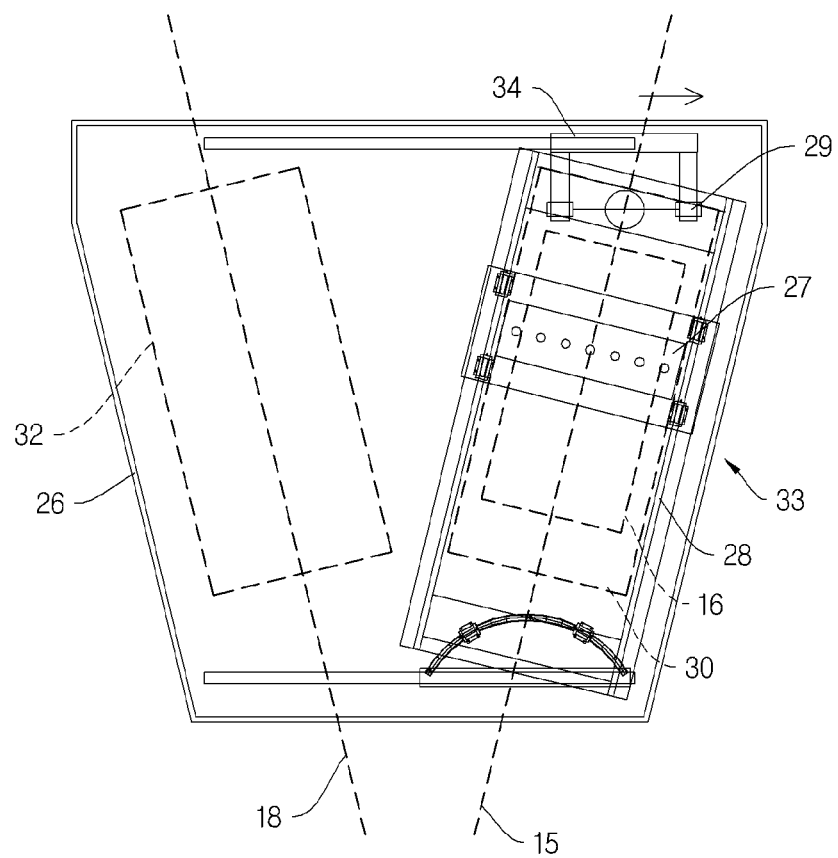

Then, as shown in FIG. 6, the rotating means 29 of the scanner 33 rotates the source moving means 28 so that the linear organic material deposition source 27 is parallel to one side of the substrate 16 (S300). Since the first substrate 16 and the second substrate 20 are put into the main chamber 26 with a slope to each other and are seated on the first substrate loading section 30 and the second substrate loading section 32, respectively, in order to efficiently deposit the organic material on the first substrate 16 or the second substrate 20 as the organic material deposition source 27 is moved linearly to face the surface of the substrate, the rotating means 29 of the scanner 33 rotates the source moving means 28 so that the longitudinal direction of the substrate side of the linear organic material deposition source 27 is parallel to one side of the substrate.

Figure 7:
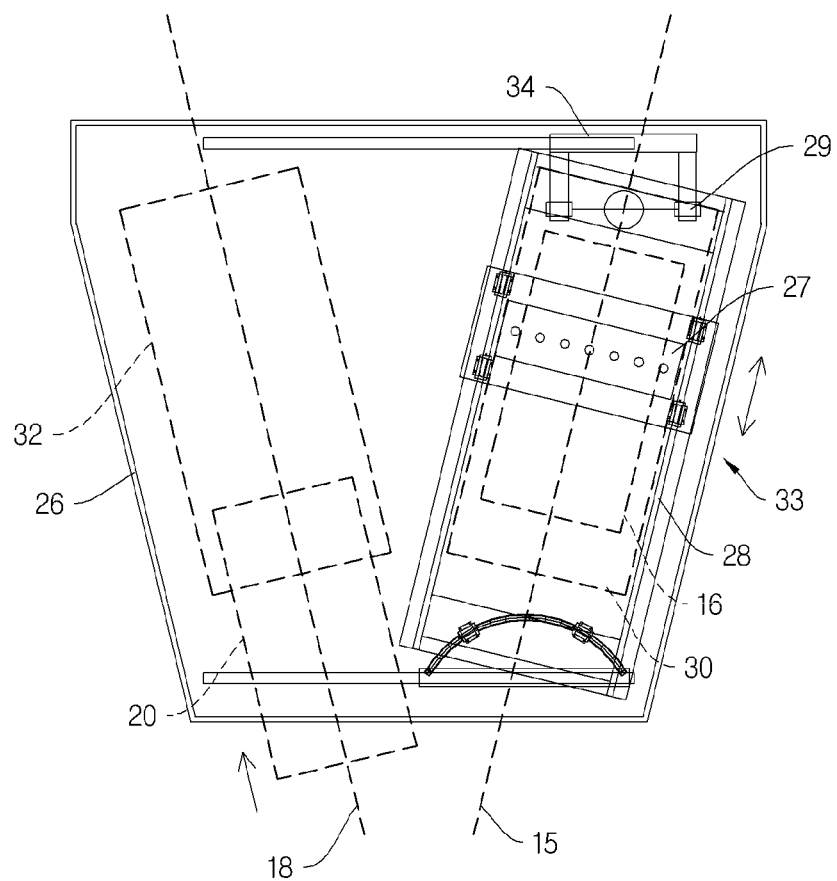

Then, as shown in FIG. 7, the source moving means 28 linearly moves the organic material deposition source 27 to deposit the organic material particles on the first substrate 16 (S400). The organic material deposition source 27 is linearly moved in an opposite other side direction from one side of the first substrate 16 by the source moving means 28 to deposit the organic material particles on the first substrate 16. The deposition of the organic material on the first substrate 16 is carried out in a manner of deposing the organic material particles sublimated from the crucible by adding heat to the crucible of the organic material evaporation source 27 which contains the organic material.

After the organic material deposition source 27 reaches the other side of the first substrate 16, it is linearly moved in the opposite direction again to prepare for a progress of the deposition process of the second substrate 20.

Then, as shown in FIG. 7, the organic material particles are deposited on the first substrate 16, and at the same time, the second substrate 20 is loaded in the second radial direction 18 and is seated on the second substrate loading section 32 (S500). It is possible to reduce the tact time by seating the second substrate 20 on the second substrate loading section 32 during the deposition process of the first substrate 16, and since loading of the second substrate 20 is performed during the deposition process of the first substrate 16, it is possible to reduce the loss of organic material.

In this process, when the second substrate 20 is seated on the second substrate loading section 32, the shadow mask is disposed on the surface of the second substrate 20, and the alignment between the second substrate 20 and the shadow mask is achieved.

In this embodiment, the meaning of "simultaneously" not only means that it is identical in view of time, but means that the deposition process of the first substrate 16 and the loading process of the second substrate 20 are performed in an overlapped manner.

Figure 8:
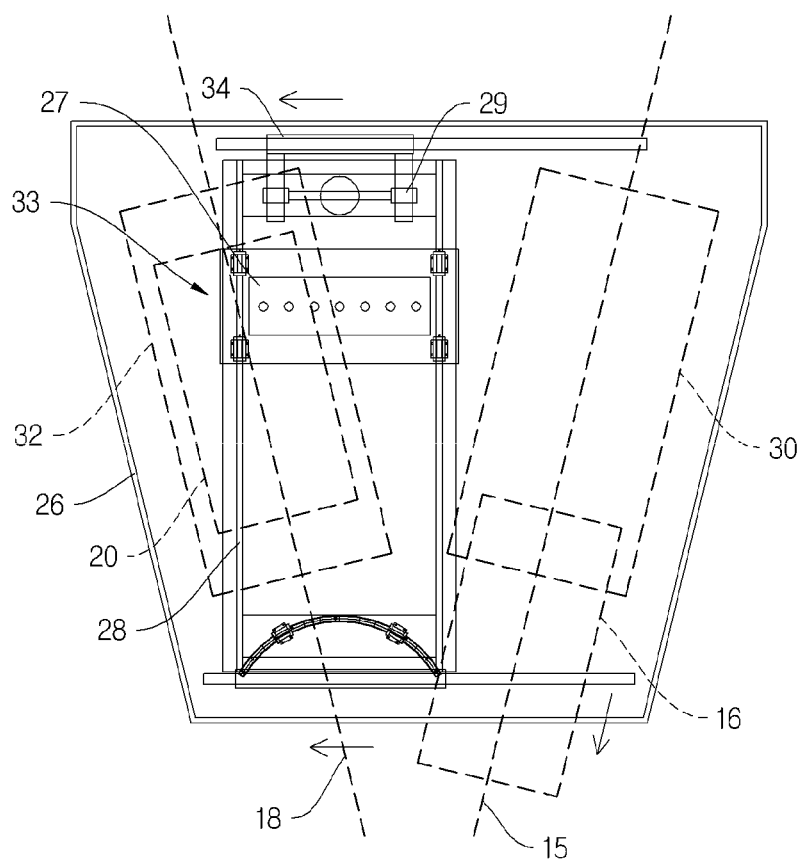
Figure 9:
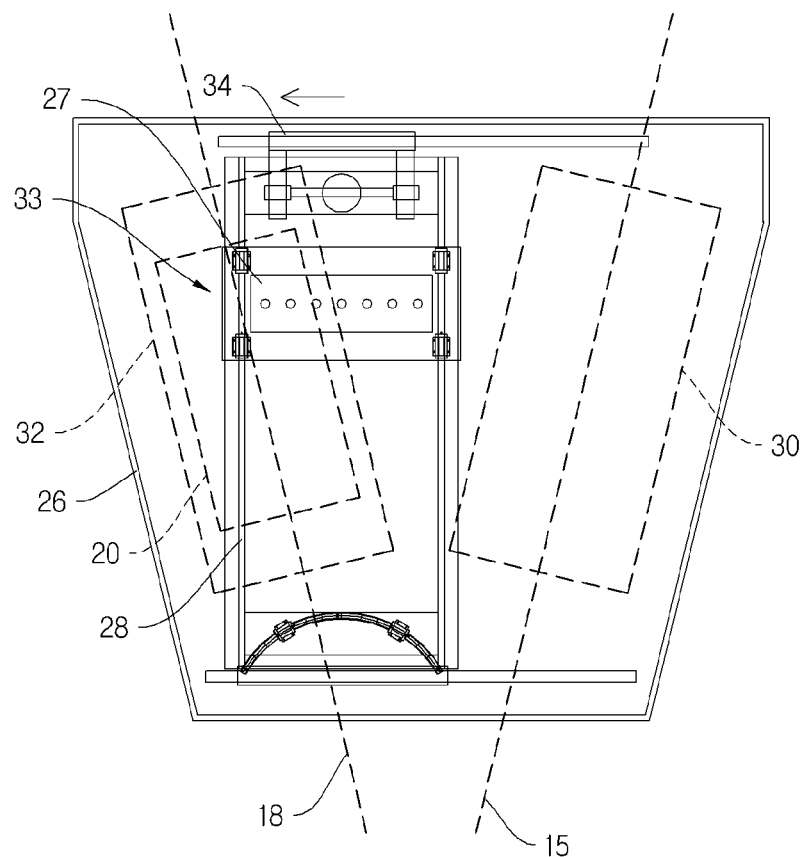

Then, as shown in FIGS. 8 and 9, when the deposition of the first substrate 16 is completed, the scanner moving means 34 moves the scanner 33 into the second deposition region 24 (S600). When the deposition of the first substrate 16 is completed, in order to perform the deposition process of the second substrate 20, the scanner 33 is moved to the second deposition region 24. In this procedure, the first substrate 16 subjected to the organic material deposition can be taken out of the main chamber 26 in the first radiation direction 15.

Figure 10:
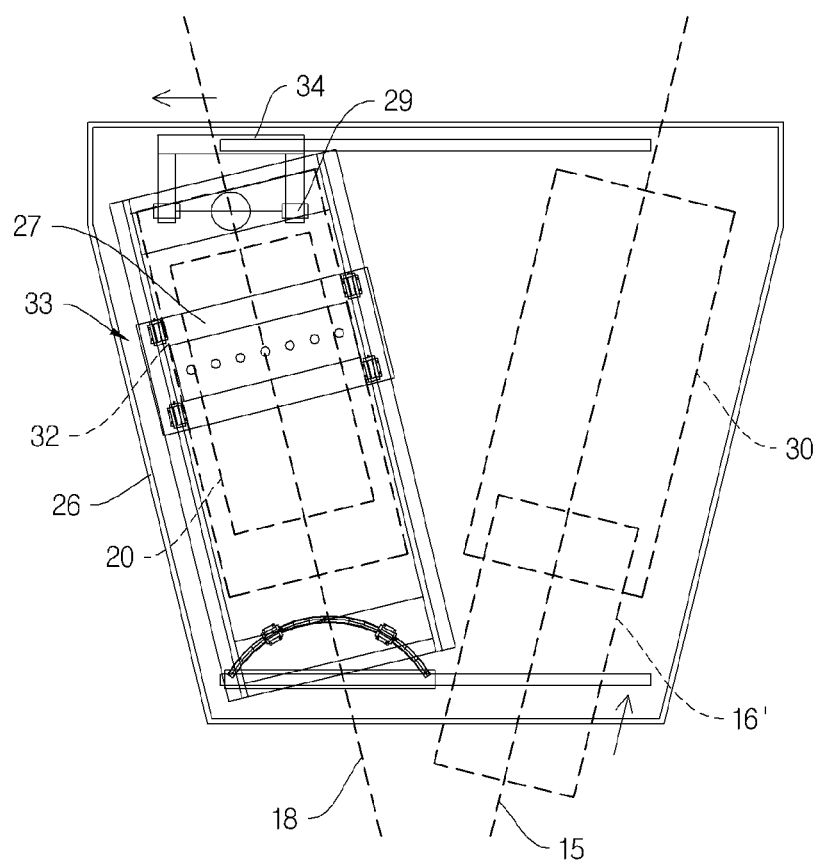

Then, as shown in FIG. 10, the rotating means 29 of the scanner 33 rotates the source moving means 28 so that the linear organic material deposition source 27 is parallel to one side of the second substrate 20 (S700). Like the process of rotating the first substrate 16, since the second substrate 20 is obliquely loaded into the main chamber 26 in second radial direction 18 and is seated on the second substrate loading section 32, in order to efficiently deposit the organic material on the second substrate 20 as the organic material deposition source 27 is moved linearly to face the surface of the substrate, the source moving means 28 is rotated so that the longitudinal direction of the organic material deposition source 27 is parallel to one side of the second substrate 20.

Moreover, the organic material deposition source 27 is moved linearly to deposit the organic material particles on the second substrate 20 (S800). Since the organic material deposition source 27 is linearly moved in the opposite other side direction from the one side of the second substrate 20 to deposit the organic material on the second substrate 20, the organic material deposition source 27 is linearly moved using the moving means.

The organic material particles are deposited on the second substrate 20, and simultaneously, a new first substrate 16' can be loaded to and seated on the first substrate loading section 30 in the first radial direction 15. When the new first substrate 16' is seated on the first substrate loading section 30, it is aligned with the shadow mask to wait for the next deposition process.

Furthermore, when the deposition process of the second substrate 20 is completed, the second substrate 20 subjected to the organic material deposited is taken out of the main chamber 26 in the second radial direction 18, and a new second substrate is loaded to and seated on the second substrate loading section 32. When a new second substrate is seated on the second substrate loading section 32, it is aligned with the shadow mask to wait for the next deposition process.

When performing the deposition process of a plurality of substrates in a single chamber according to the above-described method, it is possible to reduce the tact time by performing the transport process or the alignment process of the other substrate during the deposition process of one substrate, and it is possible to reduce the loss of organic material which occurs during the transport process and the alignment process of the substrate.

Figure 11:
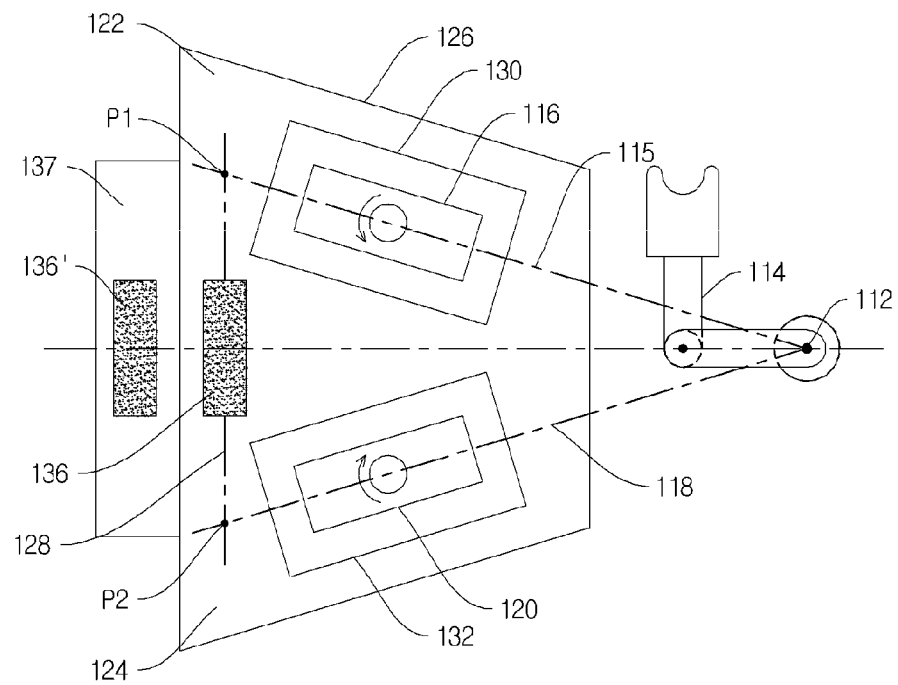
FIG. 11 is a horizontal cross-sectional view for illustrating a configuration of an organic material deposition apparatus according to a third embodiment of the present invention.
Figure 12:
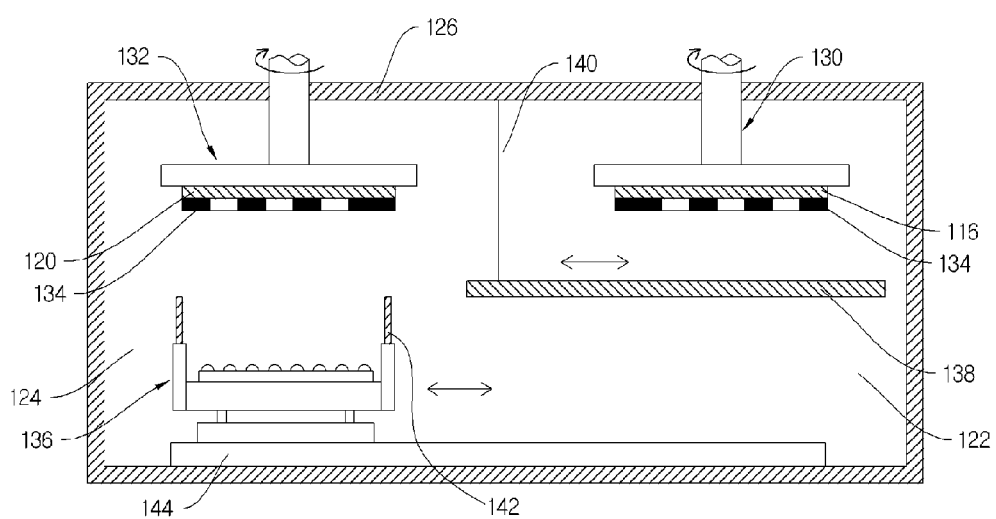
FIG. 12 is a vertical cross-sectional view for illustrating the configuration of the organic material deposition apparatus according to the third embodiment of the present invention.
Figure 13:
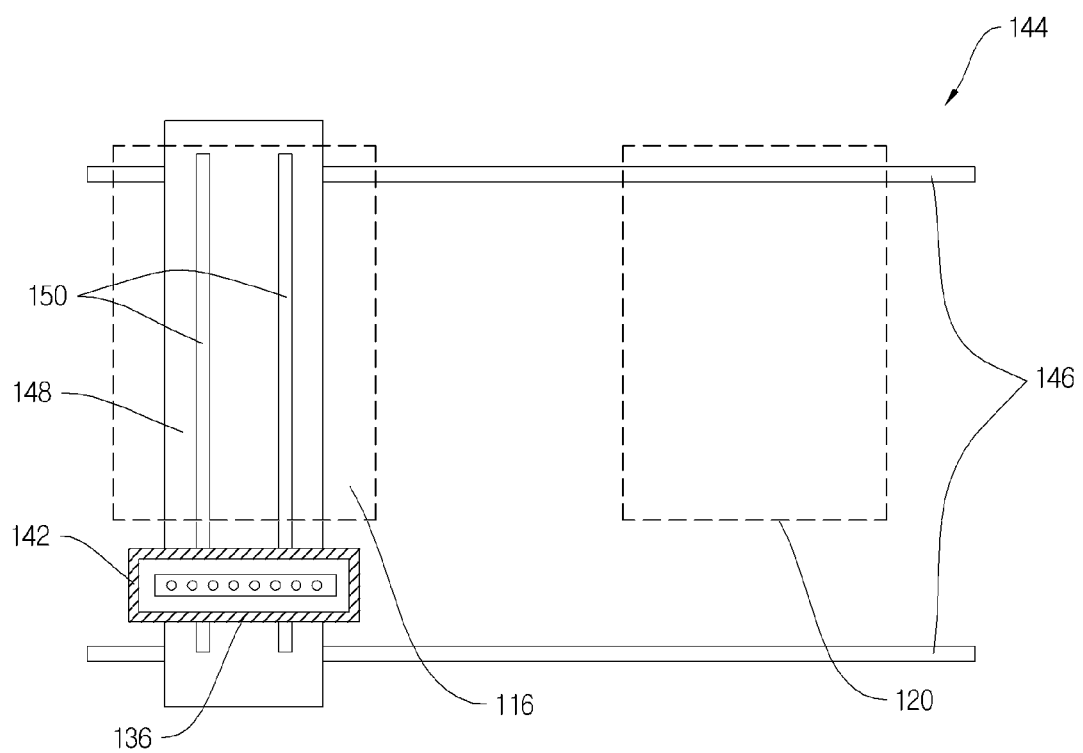
FIG. 13 is a diagram for illustrating a moving unit of the organic material deposition source of the organic material deposition apparatus according to the third embodiment of the present invention.

FIG. 11 is a horizontal cross-sectional view for illustrating a configuration of the organic material deposition apparatus according to a third embodiment of the present invention, FIG. 12 is a vertical cross-sectional view for illustrating the configuration of the organic material deposition apparatus according to the third embodiment of the present invention, and FIG. 13 is a diagram for illustrating the moving means of the organic material deposition source of the organic material deposition apparatus according to the third embodiment of the present invention.

FIGS. 11 to 13 illustrate a central point 112, a robot arm 114, a first radiation line segment 115, first substrates 116, 116', a second radiation line segment 118, a second substrate 120, a first deposition region 122, a second deposition region 124, a main chamber 126, a movement line segment 128, a first substrate loading section 130, a second substrate loading section 132, a shadow mask 134, organic material deposition sources 136, 136', a source chamber 137, a blocking plate 138, a partition wall 140, an organic material guide 142, a moving means 144, a horizontal guide section 146, a moving table 148 and a vertical guide section 150.

The organic material deposition apparatus according to this embodiment includes a main chamber 126 which is partitioned into a first deposition region 122 and a second deposition region 124, through which a first substrate 116 is put into and taken out of the first deposition region 122 from one central point 112 in a first radial direction, and through which a second substrate 120 is put into and taken out of the second deposition region 124 from the central point 112 in a second radial direction; a first substrate loading section 130 and a second substrate loading section 120 into which the first substrate 116 and the second substrate 120 are each loaded to rotate the first substrate 116 and the second substrate 120 so that one side is parallel to an imaginary movement line segment 128 that connects two arbitrary points P1, P2 of each of a first imaginary radial line segment 115 formed in the first radial direction and a second imaginary radial line segment 118 formed in the second radial direction; organic material deposition sources 136, 136' which are disposed in the main chamber 126, is moved along the movement line segment 128 so as to be located in the first deposition region 122 or the second deposition region 124, and is moved in the direction perpendicular to the movement line segment 128 to inject the organic material particles to the surface of the first substrate 116 or the second substrate 120. Accordingly, when performing the deposition process of the plurality of substrates in a single chamber, it is possible to reduce the tact time by performing the transport process or the alignment process of the other substrate during the deposition process of one substrate, and it is possible to reduce the loss of organic material which occurs during the transport process or the alignment process of the substrate.

The main chamber 126 is partitioned into the first deposition region 122 and the second deposition region 124 and is configured so that the first substrate 116 is put into and taken out of the first deposition region 122 from one central point 112 in the first radial direction and the second substrate 120 is put into and taken out of the second deposition region 124 from the central point 112 in the second radial direction.

The main chamber 126 is a place where the organic material is deposited on the substrate therein, and the interior thereof can be maintained in the vacuum state by the vacuum pump. When the organic material deposition is performed at atmospheric pressure, the interior can also be maintained under the atmospheric pressure condition. The main chamber 126 may be partitioned into a plurality of deposition regions 122, 124 so that the plurality of substrates can be deposited in one main chamber 126.

The deposition regions 122, 124 mean an imaginary space in which the organic material deposition of one substrate can be performed in accordance with the movement of the organic material deposition source 136. With reference to FIG. 1, the main chamber 126 can be partitioned into the first deposition region 122 and the second deposition region 124 by the central line of the main chamber 126 illustrated in a two-dot chain line in FIG. 1. The deposition of organic material particles of the first substrate 116 is performed in the first deposition region 122, and the deposition of organic material particles of the second substrate 120 is performed in the second deposition region 124.

The first substrate 116 is put into or taken out of the first deposition region 122 of the main chamber 126 from the one central point 112 in the first radial direction, and the second substrate 120 is put into or taken out of the second deposition region 124 of the main chamber 126 from the central point 112 in the second radial direction. That is, the first substrate 116 and the second substrate 120 are put into or taken out of the main chamber 126 with a constant slope.

In the deposition system of the cluster type, the substrate can be put into or taken out of the main chamber 126 by the robot arm 114 provided in the transfer chamber connected to the main chamber 126. Since the substrate is put into or taken out of the main chamber 126 from the rotation center of the robot arm 114 in the radial direction, the substrate can be put into or taken out of the main chamber 126 with a constant slope.

Therefore, when the first substrate 116 and the second substrate 120 are put into or taken out of the main chamber 126 by the robot arm 114, the first substrate 116 is put into or taken out of the main chamber 126 with respect to the rotation center of the robot arm 114 forming the central point 112 in the first radial direction, and the second substrate 120 is put into or taken out of the main chamber 126 with respect to the rotation center of the robot arm 116 forming the central point 112 in the second radial direction different from first radial direction.

However, without being limited to a configuration in which the first substrate 116 and the second substrate 120 are put into or taken out of the main chamber 126 by the robot arm 114, even when the substrate 116 and the second substrate 120 are put into or taken out of the main chamber 126 with a slope to each other, the organic material deposition apparatus according to the present embodiment can be applied. For example, when the first substrate 116 and the second substrate 120 are put into or taken out of the main chamber 126 by the two robot arms 114, the rotation center of the robot arm 114 does not constitute the above-mentioned central point, and a point, which is formed by intersecting the two imaginary sloping lines formed by the slope direction of the first substrate 116 and the second substrate 120, constitutes the central point 112.

The first substrate 116 and the second substrate 120 are loaded into and seated on the first substrate loading section 130 and the second substrate loading section 132, respectively. The first substrate 116 and the second substrate 120 are each rotated so that the one side is parallel to the imaginary movement line segment 128 which connects two arbitrary points P1, P2 of each of the first imaginary radial line segment 115 formed in the first radial direction and the second imaginary radial line segment 118 formed in the second radial direction.

An organic material deposition source 136 to be described below is linearly moved along the imaginary movement line segment 128 so as to be moved to the first deposition region 122 or the second deposition region 124. Such a movement line segment 128 is defined as a line segment which connects an arbitrary point P1 of the first radial line segment 115 formed by the first radial direction as the movement direction of the first substrate 116 and an arbitrary point P2 of the second imaginary radial line segment 118 formed by the second radial direction as the movement direction of the second substrate 120.

Since the first substrate 116 and the second substrate 120 are put into the main chamber 126 with a slope to each other, in order to efficiently deposit the organic material particles on the first substrate 116 or the second substrate 120 as the organic material deposition source 136 is linearly moved in a direction perpendicular to the movement line segment 128, the substrate loading sections 130, 132 rotate the substrate so that one side of the substrate is parallel to the movement line segment 128 of the organic material deposition source 136.

The organic material deposition source 136 is disposed in the main chamber 126, is moved along the movement line segment 128 so as to be positioned in the first deposition region 122 or the second deposition region 124, and is linearly moved in a direction perpendicular to the movement line segment 128 to inject the organic material particles on the surface of the first substrate 116 or the second substrate 120.

The organic material deposition source 136 is linearly moved along the movement line segment 128 so as to move to the first deposition region 122 or the second deposition region 124, and is linearly moved to the movement line segment 128 in the vertical direction to deposit the organic material on the surface of the substrate in which one side is disposed in parallel to the movement line segment 128. The deposition of organic material on the substrates is carried out in a manner of depositing the organic material particles sublimated from the crucible onto the substrate, by applying heat to the crucible of the organic material evaporation source 136 that contains the organic material.

The source chamber 137 is coupled to one side of the main chamber 126, is opened and closed to the main chamber 126 each other, and through which the organic material deposition source 136 is put into or taken out. When the organic material in the organic material deposition source 136 is exhausted during the deposition in the main chamber 126, after moving the organic material deposition source 136 to the source chamber 137, the organic material is recharged or replaced and moved into the main chamber 126 again.

Conventionally, when the organic material of the organic material deposition source is exhausted in the course of the deposition in the main chamber, the main chamber is evacuated to recharge the organic material, or after replacing the organic material deposition source, the interior of the main chamber is evacuated again to resume the deposition process. However, in the present embodiment, since the organic material deposition source 136 is moved to the source chamber 137, while maintaining the atmosphere for the deposition of the main chamber 126 without change, it is possible to omit the exhaust and re-vacuum operation of the main chamber 126.

A vacuum pump (not shown) connected to the source chamber 137 removes gas in the source chamber 137 so that the source chamber 137 has the same degree of vacuum as that of the main chamber 126. For the recharge of the organic material of the organic material deposition source 136 and replacement of the organic material deposition source 136, first, the degree of vacuum of the source chamber 137 is made to the same state as that of the degree of vacuum of the main chamber 126, a door (not shown) is opened, and the organic material deposition source 136 is moved to the source chamber 137 in the state of opening the source chamber 137 and the main chamber 126 each other. Further, the door is closed, in a state where the source chamber 137 and the main chamber 126 are closed to each other, the organic material is recharged to the organic material deposition source 136 in the source chamber 137, or after replacing a new organic material deposition source, this is put into the main chamber 126 again. Even in the re-input process, first, the degree of vacuum of the main chamber 126 matches with that of the source chamber 137, the door is opened, and the door organic material deposition source 136 is put into the main chamber 126.

On the other hand, two organic material deposition sources 136, 136' can also form a set and can also be to be arranged alternately with each other in the main chamber 126 and the source chamber 137. That is, when the organic material of the organic material deposition source 136 disposed in the main chamber 126 is exhausted, the organic material deposition source 136 in which the organic material is exhausted is moved into the source chamber 137, and the other organic material deposition source 136' disposed in the source chamber 137 is directly moved into the main chamber 126.

The organic material deposition source 136, in which the organic material in the source chamber 137 is exhausted, is recharged with the organic material or replaced with a new organic material deposition source, and is prepared so as to be replaced immediately when the organic material of the organic material deposition source 136' in the main chamber 126 is exhausted.

The blocking plate 138 is disposed to face the first substrate 116 or the second substrate 120, and is moved in the opposite direction to the organic material deposition source 136 that moves along the movement line segment 128, thereby covering the first substrate 116 or the second substrate 120. Referring to FIG. 12, when the organic material deposition source 136 is moved to the second deposition region 124 to deposit the second substrate 120, the blocking plate 138 moves in the opposite direction to cover the first substrate 116. This is to prevent the parasitic deposition in which the organic material particles evaporated from the organic material deposition source 136 while depositing the second substrate 120 is scattered and deposited to the first substrate 116. Further, when the organic material deposition source 136 is moved to the first deposition region 122 to deposit the first substrate 116, the blocking plate 138 is moved in the direction of the second deposition region 124 to cover the second substrate 120.

The partition wall 140 is coupled to the main chamber 126 and partitions the first deposition region 122 and the second deposition region 124. In this embodiment, although a form is illustrated in which the partition wall 140 is formed to extend in the direction from the upper end to the lower end of the main chamber 126 along the center line of the main chamber 126 shown by a two-dot chain line illustrated in FIG. 1, the shape and formation position of the partition wall 140 is not limited to this, and anything may be used as long as one deposition region can be partitioned from the other region. For example, when there is a standby region of the organic material deposition source 136 between the first deposition region 122 and the second deposition region 124, two partition walls may exist between the first deposition region 122 and the standby region, and between the second deposition region 124 and the standby region.

In this embodiment, the partition wall 140 is formed to extend from the upper end to the lower end of the main chamber 126 at a predetermined distance, and the blocking plate 138 is disposed in the horizontal direction to the lower end of the partition wall 140. It is possible to prevent the parasitic deposition of organic material to the adjacent substrate by the partition wall 140 and the blocking plate 138.

The organic material guide 142 is coupled to an outer wall of the organic material deposition source 136 so as to slide in the direction of the first substrate 116 or the second substrate 120, and guides the organic material particles to the facing first substrate 116 or the second substrate 120. In other words, the organic material particles evaporated from the organic material deposition source 136 are guided to the substrate facing thereto, and are prevented from being parasitically deposited to adjacent substrate. Accordingly, it is possible to achieve a uniform deposition thickness.

The organic material guide 142 is coupled to the outer wall of the organic material deposition source 136 so as to slide towards the substrate. This is to allow the organic material particles evaporated from the organic material deposition source 136 to be efficiently guided to the facing substrate, by causing the upper end of the organic material guide 142 to slide so as to get close to the facing substrate.

FIG. 13 illustrates the moving means 144 of the organic material deposition source 136 of the organic material deposition apparatus according to the present embodiment, a horizontal guide section 146 is provided on the inner wall of the main chamber 126 in the longitudinal direction of the movement line segment 128, and the moving table 148 is configured so as to be moved along the movement line segment 128 along the horizontal guide section 146. A vertical guide section 150 is provided on the moving table 148 in the vertical direction of the movement line segment 128, and the organic material deposition source 136 is configured to move along the vertical guide section 150 in the vertical line segment 128. Guide horizontal guide section 146. As the horizontal guide section 146 and the vertical guide section 150, a normal LM (linear motor) guide can be used.

Figure 14:
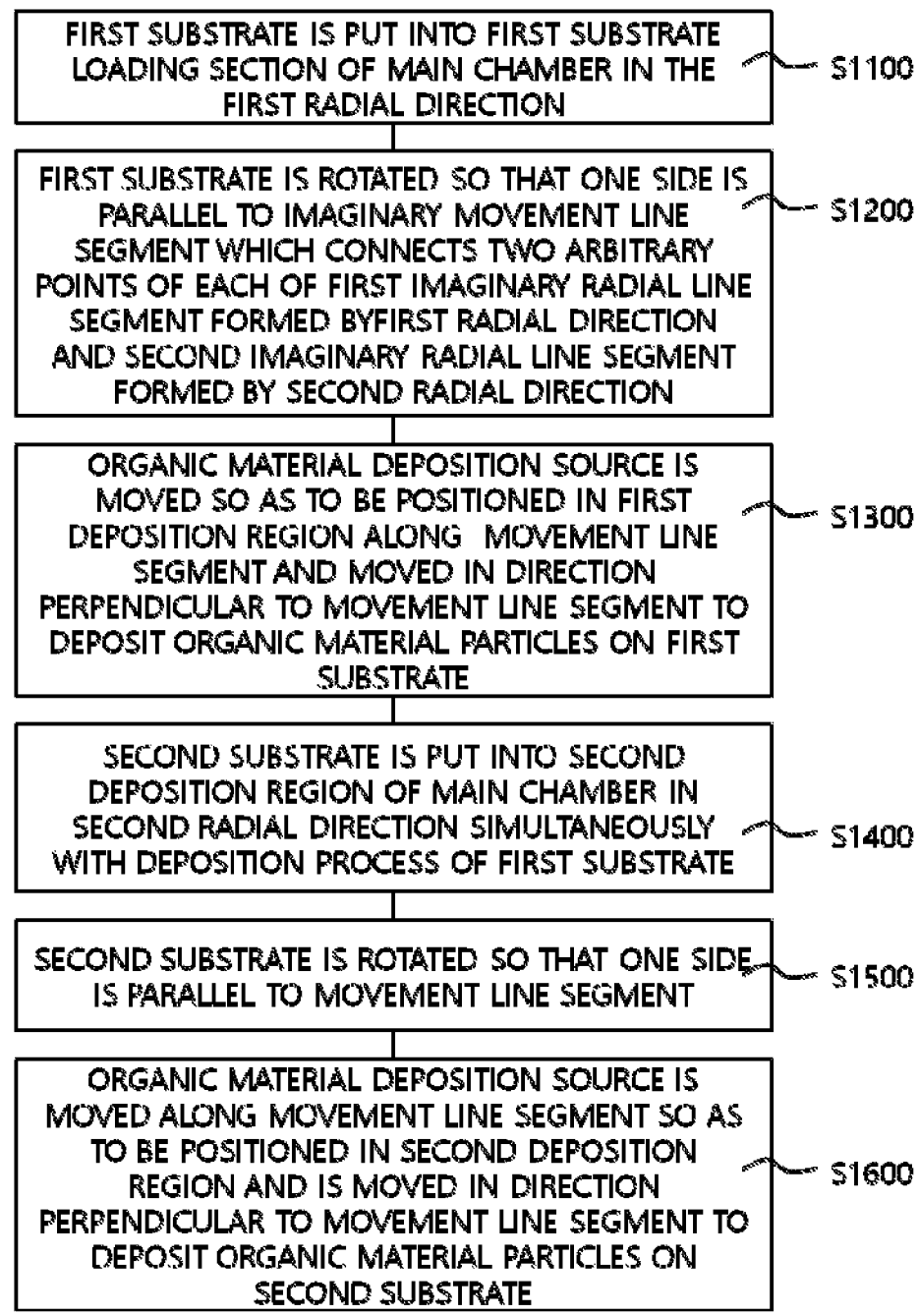
FIG. 14 is a flowchart of an organic material deposition method according to a fourth embodiment of the present invention.

FIG. 14 is a flow chart of the organic material deposition method according to the fourth embodiment of the present invention, and FIGS. 15 to 20 are flowcharts of the organic material deposition method according to the fourth embodiment of the present invention. FIGS. 15 to 20 illustrate a first radiation line segment 115, first substrates 116, 116', a second radiation line segment 118, a second substrate 120, a first deposition region 122, a second deposition region 124, a main chamber 126, a movement line segment 128, organic material deposition sources 136, 136', and a source chamber 137.

The organic material deposition method according to the present embodiment is a method for depositing the organic material within the main chamber 126 which is partitioned into a first deposition region 122 through which the first substrate 116 is put into or taken out of one central point in the first radial direction, and a second deposition region 124 through which the second substrate 120 is put into or taken out of the central point in the second radial direction, the method including: an input process of the first substrate 116 of putting the first substrate 116 into the first deposition region 122 of the main chamber 126 in the first radial direction; a rotating process of the first substrate 116 of rotating the first substrate 116 so that one side is parallel to an imaginary movement line segment 128 which connects two arbitrary points of each of a first imaginary radial line segment 115 in the first radial direction and a second imaginary radial line segment 118 in the second radial direction; a deposition process of the first substrate 116 of moving the organic material deposition source 136 along the movement line segment 128 so as to be positioned in the first deposition region 122 and moving it in a direction perpendicular to the movement line segment 128 to deposit the organic material particles on the first substrate 116; an input process of the second substrate 120 putting the second substrate 120 into the second deposition region 124 of the main chamber 126 in the second radial direction simultaneously with the deposition process of the first substrate 116; a rotating process of the second substrate 120 of rotating the second substrate 120 so that one side is parallel to the movement line segment 128; and a deposition process of the second substrate 120 of moving the organic material deposition source 136 along the movement line segment 128 so as to be positioned in the second deposition region 124 and moving it in the direction perpendicular to the movement line segment 128 to deposit the organic material particles on the second substrate 120. Thus, when performing the deposition process of the plurality of substrates in a single chamber, it is possible to reduce the tact time by performing the transport process or the alignment process of the other substrate during the deposition process of one substrate, and it is possible to reduce the loss of organic material which occurs during the transport process or the alignment process of the substrate.

The organic material deposition method according to the present embodiment relates to a method for depositing the organic material within the main chamber 126 which is partitioned into the first deposition region 122 through which the first substrate 116 is put into or taken out of one central point in the first radial direction, and the second deposition region 124 through which the second substrate 120 is put into or taken out of the central point in the second radial direction.

The organic material deposition is performed on a substrate within the main chamber 126. The main chamber 126 may be partitioned into the plurality of deposition regions 122, 124 so that the plurality of substrates can be deposited in a single main chamber 126. The organic material deposition is performed on the first substrate 116 in the first deposition region 122, and the organic material deposition is performed on the second substrate 120 in the second deposition region 124.

Figure 15:
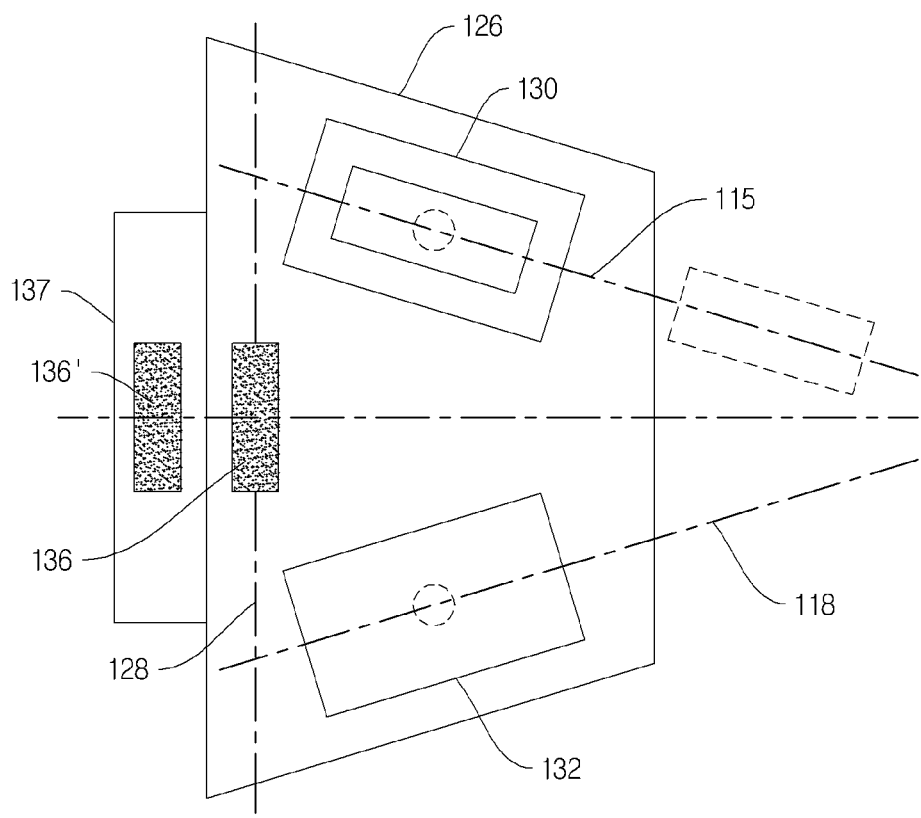
FIGS. 15 to 20 are flowcharts of the organic material deposition method according to the fourth embodiment of the present invention.

When examining the organic material deposition method according to the present embodiment, first, as shown in FIG. 15, the first substrate 116 is put into the first deposition region 122 of the main chamber 126 in the first radial direction (S1100).

In the deposition system in the cluster type, the substrate can be put into or taken out of the main chamber 126 by the robot arm 114 provided in the transfer chamber connected to the main chamber 126. Since the substrate is put into or taken out of the main chamber 126 from the rotation center of the robot arm 114 in the radial direction, the substrate can be disposed in the main chamber 126 with a constant slope.

Therefore, when the first substrate 116 is put into or taken out of the first deposition region 122 of the main chamber 126, the first substrate 116 is put into or taken out of the main chamber 126 from the rotation center of the robot arm 114 forming the central point in first radial direction.

In this process, when the first substrate 116 is put into the first deposition region 122 of the main chamber 126, the shadow mask is disposed on the surface of the first substrate 116, and alignment between the first substrate 116 and the shadow mask is achieved.

Figure 16:
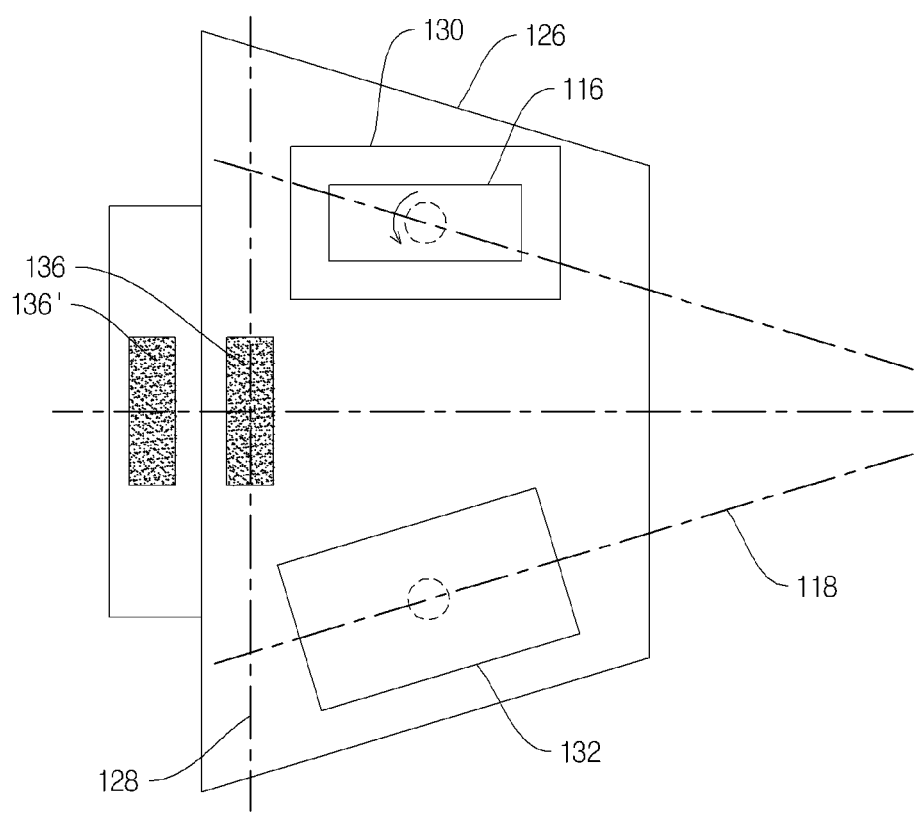

Moreover, as the rotation process of the first substrate, as shown in FIG. 16, the first substrate 116 is rotated so that the one side of the first substrate 116 is parallel to the imaginary movement line segment 128 which connects the two arbitrary points of each of the first imaginary radial line segment 115 formed by the first radial direction and the second imaginary radial line segment 118 formed by the second radial direction (S1200).

The organic material deposition source 136 linearly moves along the imaginary movement line segment 128 so as to move to the first deposition region 122 or the second deposition region 124. Such a movement line segment 128 is defined as a line segment which connects an arbitrary point of the first imaginary radial line segment 115 formed by the first radial direction as the movement direction of the first substrate 116 and an arbitrary point of the second imaginary radial line segment 118 formed by the second radial direction as the movement direction of the second substrate 120. Since the first substrate 116 and the second substrate 120 are put into the main chamber 126 with a slope to each other, the substrate is rotated so that the one side of the substrate is parallel to the movement line segment 128 of the organic material deposition source 136 so as to efficiently deposit the organic material on the first substrate 116 or the second substrate 120 as the substrate organic material deposition source 136 linearly moves in the direction perpendicular to the movement line segment 128.

Figure 17:
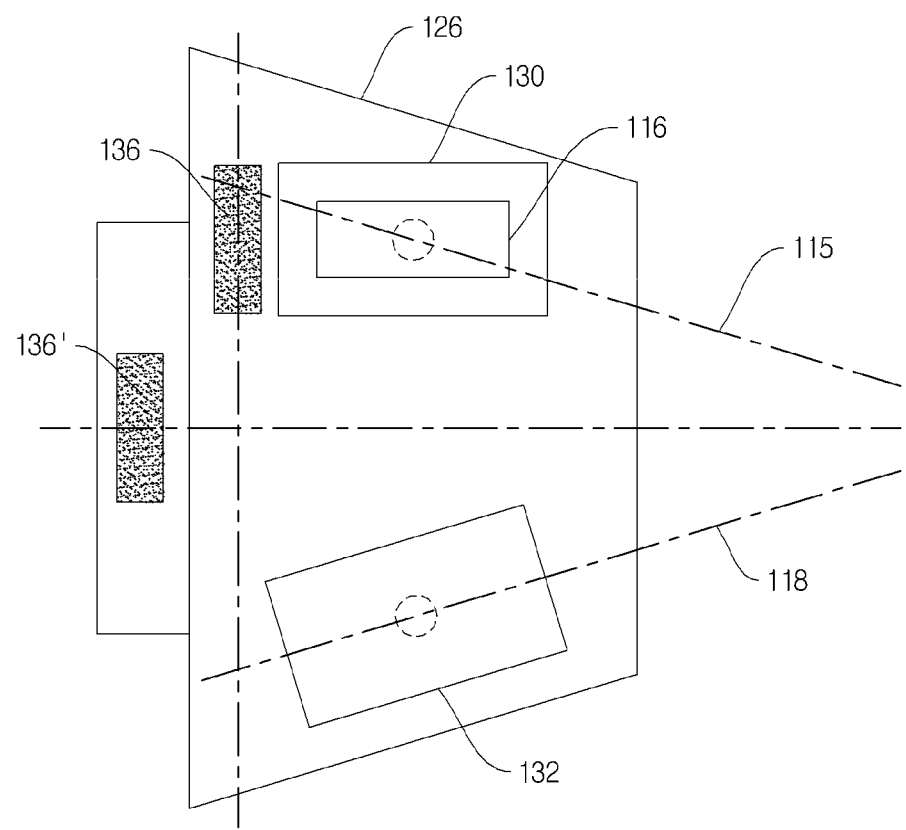
Figure 18:
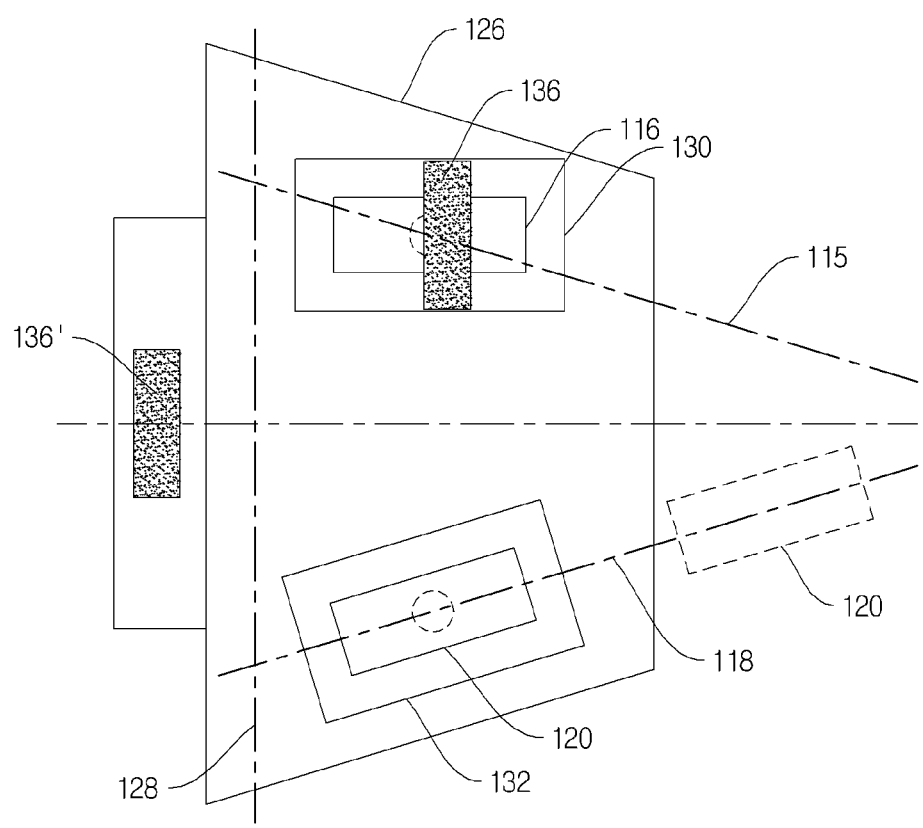

Moreover, as the first substrate deposition process, as shown in FIGS. 17 and 18, the organic material deposition source 136 is moved so as to be positioned in the first deposition region 122 along the movement line segment 128 and is moved in a direction perpendicular to the movement line segment 128 to deposit the organic material particles on the first substrate 116 (S1300).

In order to move the organic material deposition source 136 to the first deposition region 122, it is linearly moved along the movement line segment 128 and is linearly moved in a direction perpendicular to the movement line segment 128, thereby depositing the organic material on the surface of the first substrate 116 in which one side is disposed in parallel to the movement line segment 128. The deposition of the organic material on the first substrate 116 is carried out in a manner of depositing the organic material particles sublimated from the crucible onto the substrate, by applying the heat to the crucible of the organic material evaporation source 136 that contains the organic material.

Moreover, as the input process of the second substrate, as shown in FIG. 18, the second substrate 120 is put into the second deposition region 124 of the main chamber 126 in the second radial direction simultaneously with the deposition process of the first substrate 116 (S1400). It is possible to reduce the tact time by putting the second substrate 120 into the second deposition region 124 of the main chamber 126 during the deposition process of the first substrate 116, and since the second substrate 120 is input during the deposition process of the first substrate 116, it is possible to reduce the loss of organic material.

In this process, when the second substrate 120 is put into the second deposition region 124 of the main chamber 126, a shadow mask is placed on the surface of the second substrate 120, and the alignment between the second substrate 120 and the shadow mask is achieved.

In this embodiment, the meaning of "simultaneously" not only means that it is identical in view of time, but means that the deposition process of the first substrate 116 and the input process of the second substrate 120 are performed in an overlapped manner.

Figure 19:
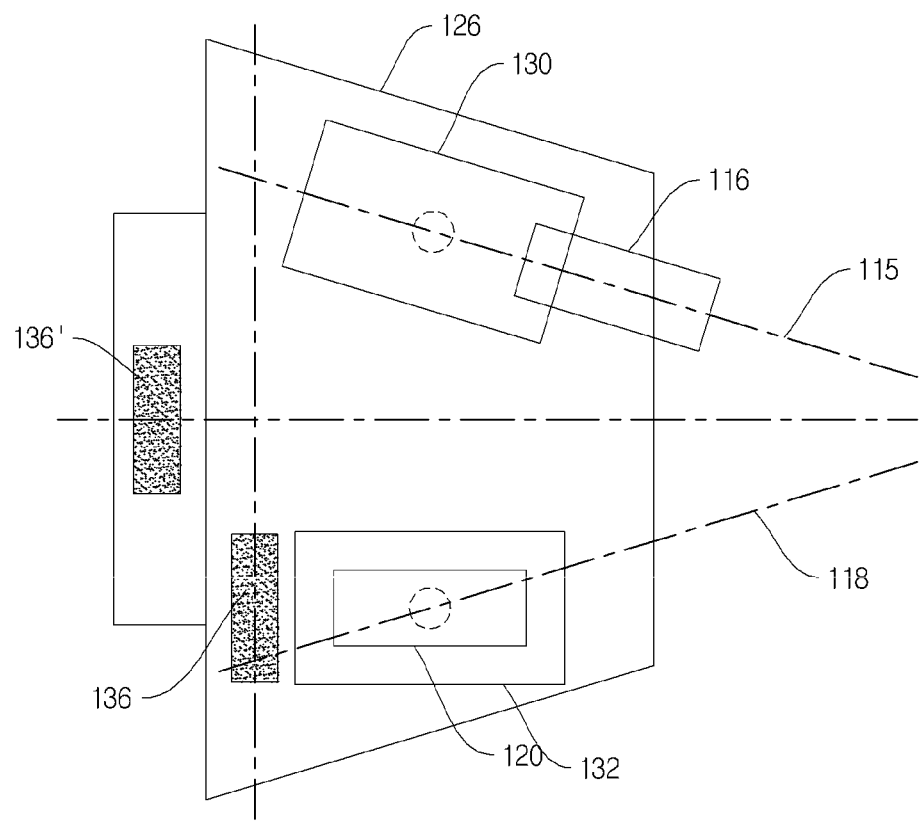

Moreover, as a rotation process of the second substrate, as shown in FIG. 19, the second substrate 120 is rotated so that the one side is parallel to the movement line segment 128 (S1500). Like the rotation process of the first substrate, since the second substrate 120 is obliquely put into the main chamber 126 in the second radial direction, in order to efficiently deposit the organic material on the second substrate 120 as the organic material deposition source 136 is moved linearly in the direction perpendicular to the movement line segment 128, the second substrate 120 is rotated so that the one side of the second substrate 120 is parallel to the movement line segment 128 of the organic material deposition source 136.

When the first substrate deposition process is completed, as shown in FIG. 19, the first substrate 116 subjected to the organic material deposition can be taken out of the main chamber 126 in the first radial direction.

Figure 20:
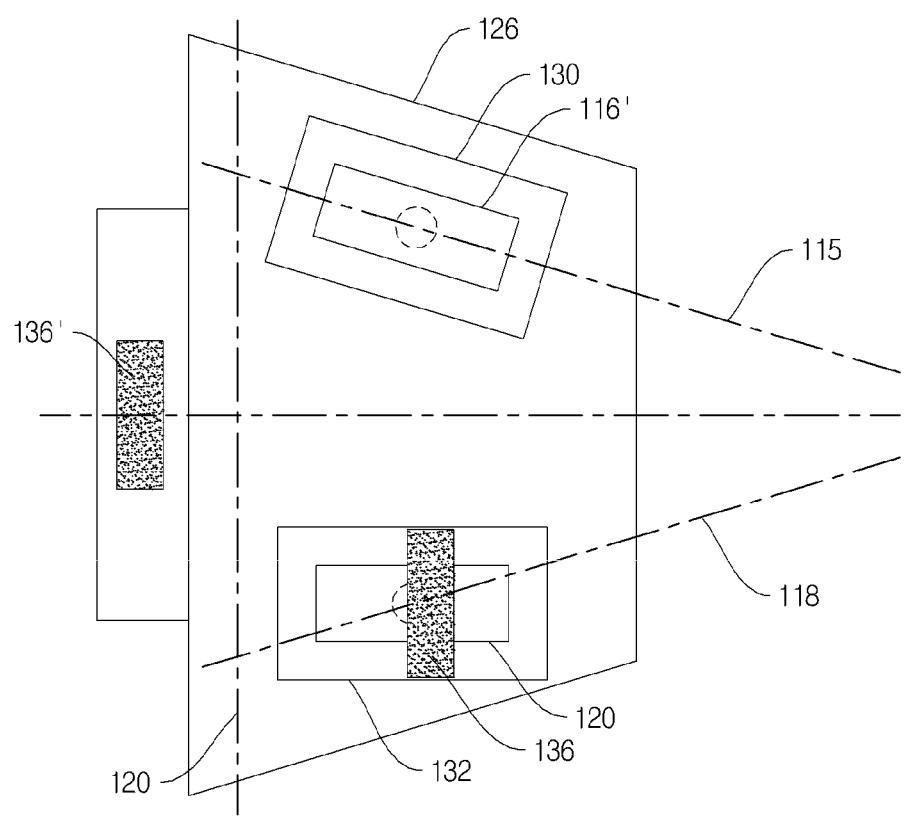

As the second substrate deposition process, as shown in FIGS. 19 and 20, the organic material deposition source 136 is moved along the movement line segment 128 so as to be positioned at the second deposition region 124, and is moved in a direction perpendicular to the movement line segment 128 to deposit the organic material particles on the second substrate 120 (S1600).

The organic material deposition source 136 is linearly moved along the movement line segment 128 so as to be moved to the second deposition region 124 and is move linearly in a direction perpendicular to the movement line segment 128, thereby depositing the organic material on the surface of the second substrate 120 in which the one side is disposed in parallel to the movement line segment 128.

Simultaneously with the deposition process of the second substrate 120, a new first substrate 116' is put into the first deposition region 122 of the main chamber 126 in the first radial direction and is aligned with the shadow mask to wait for the next deposition process.

Also, when the second substrate deposition process is completed, the second substrate 120 subjected to the organic material deposition is taken out of the main chamber 126 in the second radiation direction, and a new second substrate is put into the second deposition region 124 of the main chamber 126 and is aligned with the shadow mask to wait for the next deposition process.

According to the above-described method, when performing the deposition process of the plurality of substrates in a single chamber, it is possible to reduce the tact time by performing the transport process or the alignment process of the other substrate during the deposition process of one substrate, and it is possible to reduce the loss of organic material which occurs during the transport process or the alignment process of the substrate.

On the other hand, the two organic material deposition sources 136, 136' form a pair, and the source chamber 137, which is opened and closed to the main chamber 126 each other and though which the organic material deposition sources 136, 136' are put into or taken out, can be coupled to the one side of the main chamber 126. In this case, the pair of organic material deposition sources 136, 136' can be disposed alternately with each other in the main chamber 126 and the source chamber 137. That is, when the organic material of the organic material deposition source 136 disposed in the main chamber 126 is exhausted, the organic material deposition source 136, in which the organic material of the organic material deposition source 136 disposed in the main chamber 126 is exhausted, is moved into the source chamber 137, and the other organic material deposition source 136' disposed in the source chamber 137 is directly moved into the main chamber 126. The organic material deposition source 136 in which the organic material in the source chamber 137 is exhausted is recharged with the organic material or replaced with a new organic material deposition source, and is prepared so as to be replaced immediately when the organic material of the organic material deposition source 136' in the main chamber 126 is exhausted.

Figure 21:
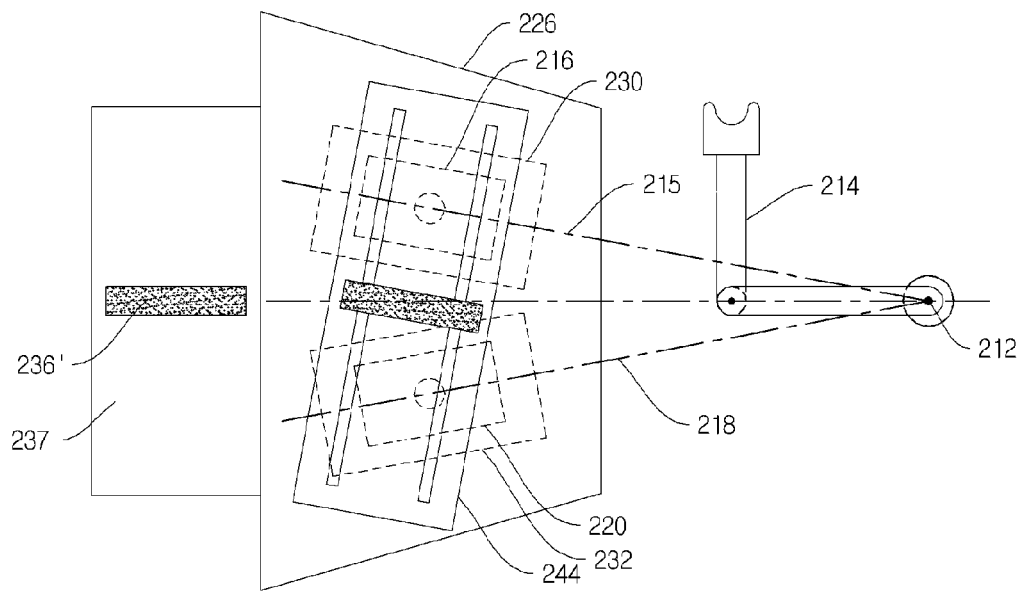
FIG. 21 is a horizontal cross-sectional view for illustrating a configuration of an organic material deposition apparatus according to a fifth embodiment of the present invention.
Figure 22:
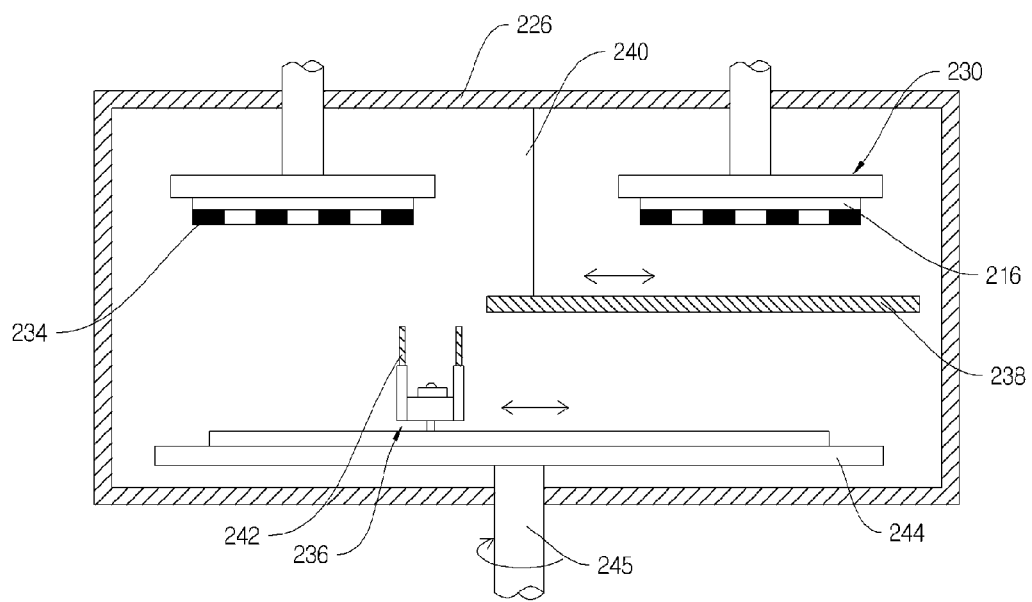
FIG. 22 is a vertical cross-sectional view for illustrating the configuration of the organic material deposition apparatus according to the fifth embodiment of the present invention.
Figure 23:
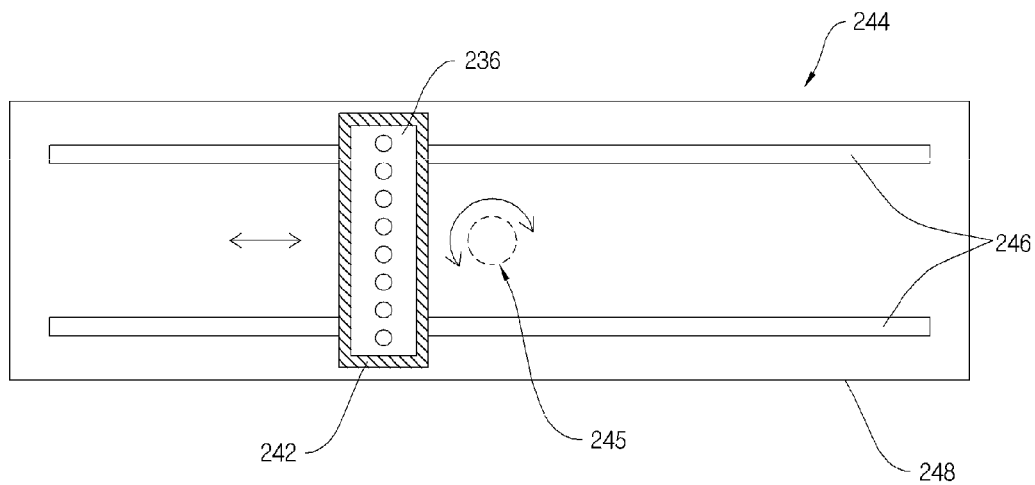
FIG. 23 is a diagram for illustrating the moving unit of the organic material deposition source of the organic material deposition apparatus according to the fifth embodiment of the present invention.

FIG. 21 is a horizontal cross-sectional view for illustrating the configuration of the organic material deposition apparatus according to a fifth embodiment of the present invention, FIG. 22 is a vertical cross-sectional view for illustrating the configuration of the organic material deposition apparatus according to a fifth embodiment of the present invention, and FIG. 23 is a view for illustrating the moving unit of the organic material deposition source of the organic material deposition apparatus according to a fifth embodiment of the present invention. FIGS. 21 to 23 illustrate a central point 212, a robot arm 214, a first radial direction 215, a first substrate 216, a second radial direction 218, a second substrate 220, a main chamber 226, a first substrate loading section 230, a second substrate loading section 232, a shadow mask 234, an organic material deposition source 236, 236', a source chamber 237, a blocking plate 238, a partition wall 240, an organic material guide 242, a moving means 244, a straight guide section 246, a moving table 248, and a rotating means 245.

The organic material deposition apparatus according to this embodiment includes a main chamber 226 through which a first substrate 216 is put into and taken out of one central point 212 in a first radial direction 215 and through which a second substrate 220 is put into and taken out of the central point 212 in a second radial direction 218; a first substrate loading section 230 on which the first substrate 216 is loaded in the first radial direction 215 and seated; a second substrate loading section 232 on which the second substrate 220 is loaded in the second radial direction 218 and seated; a linear organic material deposition source 236 which injects the organic material particles onto the surface of the first substrate 216 or the second substrate 220; a moving means 244 for linearly moving the organic material deposition source 236 so that the organic material particles are injected onto the surface of the first substrate 216 or the second substrate 220; and rotating means 245 for rotating the moving means 244 so that the linear organic material deposition source 236 is parallel to one side of the first substrate 216 or the second substrate 220. Accordingly, when performing the deposition process of the plurality of substrates in a single chamber, it is possible to reduce the tact time by performing the transport process or the alignment process of the other substrate during the deposition process of one substrate, and it is possible to reduce the loss of organic material which occurs during the transport process or the alignment process of the substrate.

The main chamber 226 is configured so that the first substrate 216 is put into and taken out of the one central point 212 in the first radial direction 215 and the second substrate 220 is put into and taken out of the central point 212 in the second radial direction 218.

The main chamber 226 is a place where the organic material is deposited on the substrate therein, and the interior thereof can be maintained in the vacuum state by the vacuum pump. When the organic material deposition is performed at atmospheric pressure, the interior can also be maintained under the atmospheric pressure condition. The main chamber 226 is be configured so that the plurality of substrates can be deposited in one main chamber 226.

The first substrate 216 is put into or taken out of the main chamber 226 from the one central point 212 in the first radial direction 215, and the second substrate 220 is put into or taken out of the main chamber 226 from the central point 212 in the second radial direction 218. That is, the first substrate 216 and the second substrate 220 are put into or taken out of the main chamber 226 with a constant slope.

In the deposition system of the cluster type, the substrate can be put into or taken out of the main chamber 226 by the robot arm 214 provided in the transfer chamber connected to the main chamber 226. Since the substrate is put into or taken out of the main chamber 226 from the rotation center of the robot arm 214 in the radial direction, the substrate can be put into or taken out of the main chamber 226 with a constant slope.

Therefore, when the first substrate 216 and the second substrate 220 are put into or taken out of the main chamber 226 by the robot arm 214, the first substrate 216 is put into or taken out of the main chamber 226 with respect to the rotation center of the robot arm 214 forming the central point 212 in the first radial direction, and the second substrate 220 can be put into or taken out of the main chamber 226 with respect to the rotation center of the robot arm 214 forming the central point 212 in the second radial direction 218 different from first radial direction 215.

However, without being limited to a configuration in which the first substrate 216 and the second substrate 220 are put into or taken out of the main chamber 226 by the robot arm 214, when the substrate 216 and the second substrate 220 are put into or taken out of the main chamber 226 with a slope to each other, the organic material deposition apparatus according to the present embodiment can be applied. For example, when the first substrate 216 and the second substrate 220 are put into or taken out of the main chamber 226 by the two robot arms 214, the rotation center of the robot arm 214 does not constitute the above-mentioned central point 212, and a point, on which the two imaginary sloping lines formed by the slope direction of the first substrate 216 and the second substrate 220 meet, constitutes the central point 212.

The first substrate 216 and the second substrate 220 are loaded to and seated on the first substrate loading section 230 and the second substrate loading section 232, respectively. In this embodiment, the upper surfaces of the first substrate 216 and the second substrate 220 are each attached to the lower surfaces of the first substrate loading section 230 and the second substrate loading section 232 so that the organic material particles are injected upward from the organic material deposition source 236 and the organic material can be deposited on the substrate.

When the first substrate 216 and the second substrate 220 are each loaded to and seated on the first substrate loading section 230 and the second substrate loading section 232, the shadow mask 234 is disposed on the surface of the substrate in each of the substrate loading sections 230, 232, and the substrate and the shadow mask 234 can be aligned with one another.

The linear organic material deposition source 236 injects the organic material particles onto the surface of the first substrate 216 or the second substrate 220. The linear organic material deposition source 236 linearly moves in the opposite other side direction from the one side of the substrate to deposit the organic materials on the substrate, and is linearly configured to correspond to the width of the substrate. The deposition of the organic material to the substrate is are carried out in a manner of depositing the organic material particles sublimated from the crucible by applying heat to the crucible of the organic material evaporation source 236 that contains the organic material.

The moving means 244 linearly moves the organic material deposition source 236 so that the organic material particles are injected onto the surface of the first substrate 216 or the second substrate 220. As described above, since the organic material deposition source 236 linearly moves in the opposite other direction from the one side of the substrate to deposit the organic material on the substrate, the organic material deposition source 236 is linearly moved by utilizing the moving means 244.

FIG. 23 illustrates the moving means 244 of the organic material deposition source 236 of the organic material deposition apparatus according to the present embodiment, and the moving means 244 includes a moving table 248 to the center of which the rotary shaft of the rotating means 245 is coupled, and a liner guide section 246 which is coupled to the upper surface of the moving table 248 to linearly move the organic material deposition source 236. The organic material deposition source 236 linearly moves on the moving table 248 along the straight guide section 246, and the rotating means 245 rotate the moving table 248 to rotate the moving means 244 so that the linear organic material deposition source 236 is parallel to the one side of the first substrate 216 or the second substrate 220. As the straight guide section 246, a normal LM (linear motor) guide can be used.

The rotating means 245 rotates the moving means 244 so that the linear organic material deposition source 236 is parallel to the one side of the first substrate 216 or the second substrate 220. Since the first substrate 216 and the second substrate 220 are obliquely put into the main chamber 226 each other, in order to efficiently deposit the organic material on the first substrate 216 or the second substrate 220 as the organic material deposition source 236 moves linearly to face the surface of the substrate, the rotating means 245 rotates the moving means 244 so that the one side of the substrate is parallel to the longitudinal direction of the linear organic material deposition source 236 linearly moved by the moving means 244.

For example, as shown in FIG. 21, the first substrate 216 is obliquely loaded into the main chamber 226 in the first radial direction 215 and is seated on the first substrate loading unit 230, and in a state where the rotating means 245 rotate the moving means 244 so that the one side of the first substrate 216 is parallel to the longitudinal direction of the linear organic material deposition source 236, the organic material deposition source 236 is linearly moved in the direction of the first substrate 216 by the moving means 244, thereby depositing the organic material particles on the surface of the first substrate 216.

The rotating means 245 can include a rotary shaft coupled to the moving means 244, and a rotation drive unit for rotating the rotary shaft.

The source chamber 237 is coupled to one side of the main chamber 226, is opened and closed to the main chamber 226 each other, and through which the organic material deposition source 236 is put into or taken out. When the organic material in the organic material deposition source 236 is exhausted during the deposition in the main chamber 226, after moving the organic material deposition source 236 to the source chamber 237, the organic material is recharged or replaced and moved into the main chamber 226 again.

Conventionally, when the organic material of the organic material deposition source 236 is exhausted in the course of the deposition in the main chamber 226, the main chamber 226 is evacuated to recharge the organic material, or after replacing the organic material deposition source 236, the interior of the main chamber 226 is evacuated again to resume the deposition process. However, in the present embodiment, since the organic material deposition source 236 is moved to the source chamber 237, while maintaining the atmosphere for the deposition of the main chamber 226 without change, it is possible to omit the exhaust and re-vacuum operation of the main chamber 226.

A vacuum pump (not shown) connected to the source chamber 237 removes gas in the source chamber 237 so that the source chamber 237 has the same degree of vacuum as that of the main chamber 226. For the recharge of the organic material of the organic material deposition source 236 and replacement of the organic material deposition source 236, first, the degree of vacuum of the source chamber 237 is made to the same state as that of the degree of vacuum of the main chamber 226, a door (not shown) is opened, and the organic material deposition source 236 is moved to the source chamber 237 in the state of opening the source chamber 237 and the main chamber 226 each other. Further, the door is closed, in a state where the source chamber 237 and the main chamber 226 are closed to each other, the organic material is recharged to the organic material deposition source 236 in the source chamber 237, or after replacing a new organic material deposition source, this is put into the main chamber 226 again. Even in the re-input process, first, the degree of vacuum of the main chamber 226 matches with that of the source chamber 237, the door is opened, and the door organic material deposition source 236 is put into the main chamber 226.

On the other hand, the two organic material deposition sources 236, 236' can form a set and can also be to be arranged alternately with each other in the main chamber 226 and the source chamber 237. That is, when the organic material of the organic material deposition source 236 disposed in the main chamber 226 is exhausted, the organic material deposition source 236 in which the organic material is exhausted is moved into the source chamber 237, and the other organic material deposition source 236' disposed in the source chamber 237 is directly moved into the main chamber 226. The organic material deposition source 236, in which the organic material in the source chamber 237 is exhausted, is recharged with the organic material or replaced with a new organic material deposition source, and is prepared so as to be replaced immediately when the organic material of the organic material deposition source 236' in the main chamber 226 is exhausted.

The blocking plate 238 is disposed to face the first substrate 216 or the second substrate 220, and is moved in the opposite direction to the organic material deposition source 236 that linearly moves by the moving means 244, thereby covering the first substrate 216 or the second substrate 220. Referring to FIG. 22, when the organic material deposition source 236 is moved along the surface of the second substrate 220 to deposit the second substrate 220, the blocking plate 238 moves in the opposite direction to cover the first substrate 216. This is to prevent the parasitic deposition in which the organic material particles evaporated from the organic material deposition source 236 while depositing the second substrate 220 is scattered and deposited to the first substrate 216. Further, when the organic material deposition source 236 is moved along the surface of the first substrate 216 to deposit the first substrate 216, the blocking plate 238 is moved in the opposite direction to cover the second substrate 220.

The partition wall 240 is coupled to the main chamber 226 and is located between the first substrate loading section 230 and the second substrate loading section 232. In this embodiment, although a form is illustrated in which the partition wall 240 is formed to extend in the direction from the upper end to the lower end of the main chamber 226 along the center line of the main chamber 226 shown by a two-dot chain line illustrated in FIG. 21, the shape and formation position of the partition wall 240 are not limited to this, and anything may be used as long as one the substrate seated on the one substrate loading section can be isolated from the substrate seated on the other substrate loading section. That is, anything may be used as long as it is possible to prevent the organic material particles from being parasitically deposited on the other substrate loading section when the organic material deposition is performed on the substrate seated on one substrate loading section. For example, when there is a standby region of the organic material deposition source 236 between the first substrate loading section 230 and the second substrate loading section 232, two partition walls 240 may exist between the first substrate loading section between 230 and the standby region, and between the second substrate loading section 232 and the standby region, respectively.

In this embodiment, the partition wall 240 is formed to extend from the upper end to the lower end of the main chamber 226 at a predetermined distance, and the blocking plate 238 is disposed in the horizontal direction to the lower end of the partition wall 240. It is possible to prevent the parasitic deposition of organic material to the adjacent substrate by the partition wall 240 and the blocking plate 238.

The organic material guide 242 is coupled to an outer wall of the organic material deposition source 236 so as to slide in the direction of the first substrate 216 or the second substrate 220, and guides the organic material particles to the facing first substrate 216 or the second substrate 220. In other words, the organic material particles evaporated from the organic material deposition source 236 are guided to the substrate facing thereto, and are prevented from being parasitically deposited to adjacent substrate. Accordingly, it is possible to achieve a uniform deposition thickness.

The organic material guide 242 is coupled to the outer wall of the organic material deposition source 236 so as to slide towards the substrate. This is to allow the organic material particles evaporated from the organic material deposition source 236 to be efficiently guided to the facing substrate, by causing the upper end of the organic material guide 242 to slide so as to get close to the facing substrate.

Figure 24:
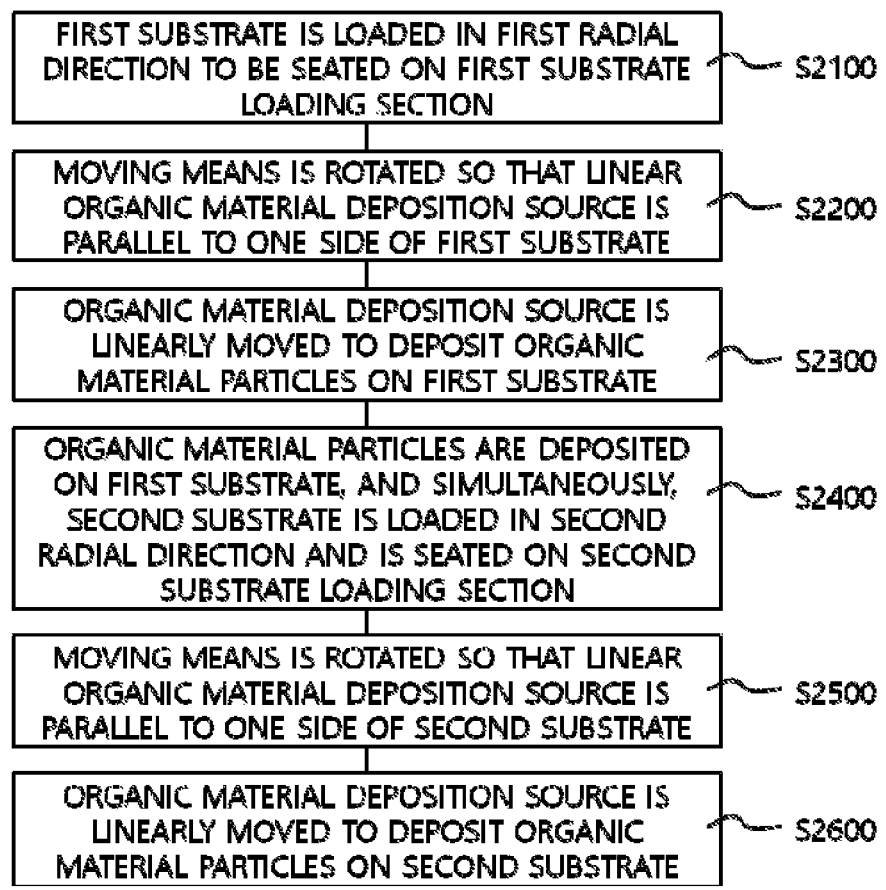
FIG. 24 is a flowchart of an organic material deposition method according to a sixth embodiment of the present invention.

FIG. 24 is a flowchart of the organic material deposition method according to the sixth embodiment of the present invention, and FIGS. 25 to 30 are flowcharts of the organic material deposition method according to the sixth embodiment of the present invention.

FIG. 25 to FIG. 30 illustrate a first radial direction 215, first substrates 216, 216', a second radial direction 218, a second substrate 220, a main chamber 226, organic material deposition sources 236, 236', and a source chamber 237.

The organic material deposition method according to the present embodiment is a method for depositing an organic material using the organic material deposition apparatus, the method including: loading the first substrate 216 in the first radiation direction 215 to be seated on the first substrate loading section 230; rotating the moving means so that the linear organic material deposition source 236 is parallel to one side of the first substrate 216; linearly moving the organic material deposition source 236 to deposit the organic material particles on the first substrate 216; loading the second substrate 220 in the second radial direction 218 so as to be seated on the second substrate loading section 232 simultaneously with depositing the organic material particles on the first substrate 216; rotating the moving means so that the linear organic material deposition source 236 is parallel to one side of the second substrate 220; and linearly moving the organic material deposition source 236 to deposit the organic material particles on the second substrate 220. Accordingly, when performing the deposition process of the plurality of substrates in a single chamber, it is possible to reduce the tact time by performing the transport process or the alignment process of the other substrate during the deposition process of one substrate, and it is possible to reduce the loss of organic material which occurs during the transport process or the alignment process of the substrate.

Figure 25:
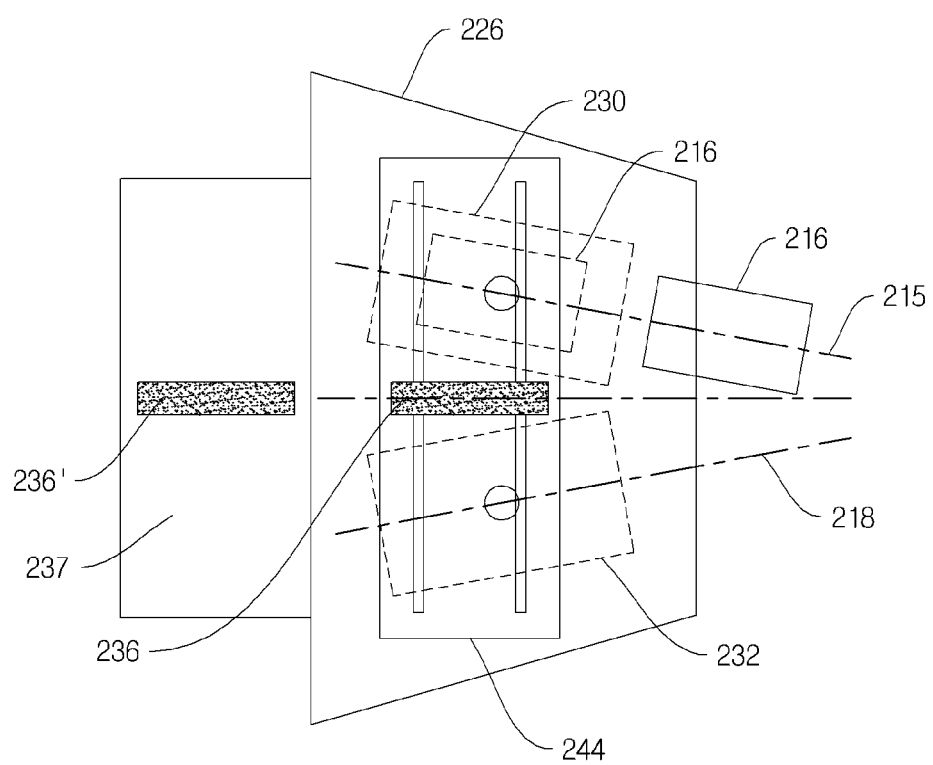
FIGS. 25 to 30 are flowcharts of the organic material deposition method according to the sixth embodiment of the present invention.

When examining the organic material deposition method according to the present embodiment, first, as shown in FIG. 25, the first substrate 216 is loaded in the first radial direction 215 to be seated on the first substrate loading section 230 (S2100).

In the deposition system in the cluster type, the substrate can be put into or taken out of the main chamber 226 by the robot arm 214 provided in the transfer chamber connected to the main chamber 226. Since the substrate is put into or taken out of the main chamber 226 from the rotation center of the robot arm 214 in the radial direction, the substrate can be disposed in the main chamber 226 with a constant slope.

Therefore, when the first substrate 216 is seated on the first substrate loading section 230 of the main chamber 226, the first substrate 216 is seated on the first substrate loading section 230 from the rotation center of the robot arm 214 forming the central point in first radial direction 215.

In this process, when the first substrate 216 is seated on the first substrate loading section 230, the shadow mask is disposed on the surface of the first substrate 216, and alignment between the first substrate 216 and the shadow mask is achieved.

Figure 26:
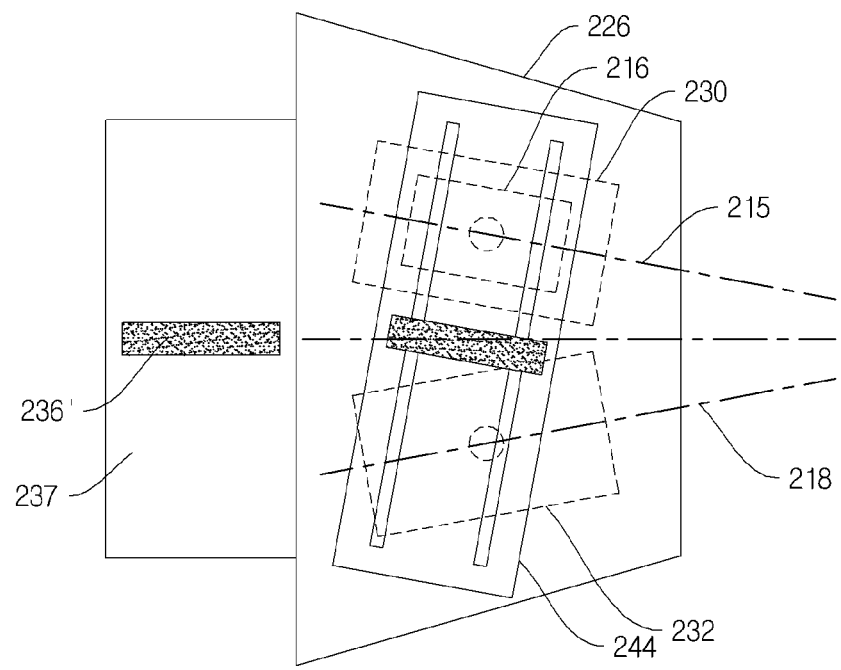

Moreover, as shown in FIG. 26, the moving means is rotated so that the linear organic material deposition source 236 is parallel to the one side of the first substrate 216 (S2200).

Since the first substrate 216 and the second substrate 220 are put into the main chamber 226 with a slope to each other and are seated on the first substrate loading section 230 and the second substrate loading section 232, respectively, in order to efficiently deposit the organic material on the first substrate 216 or the second substrate 220 as the organic material deposition source 236 is moved linearly to face the surface of the substrate, the moving means is rotated so that the longitudinal direction of the linear organic material deposition source 236 linearly moved by the moving means is parallel to one side of the substrate.

Figure 27:
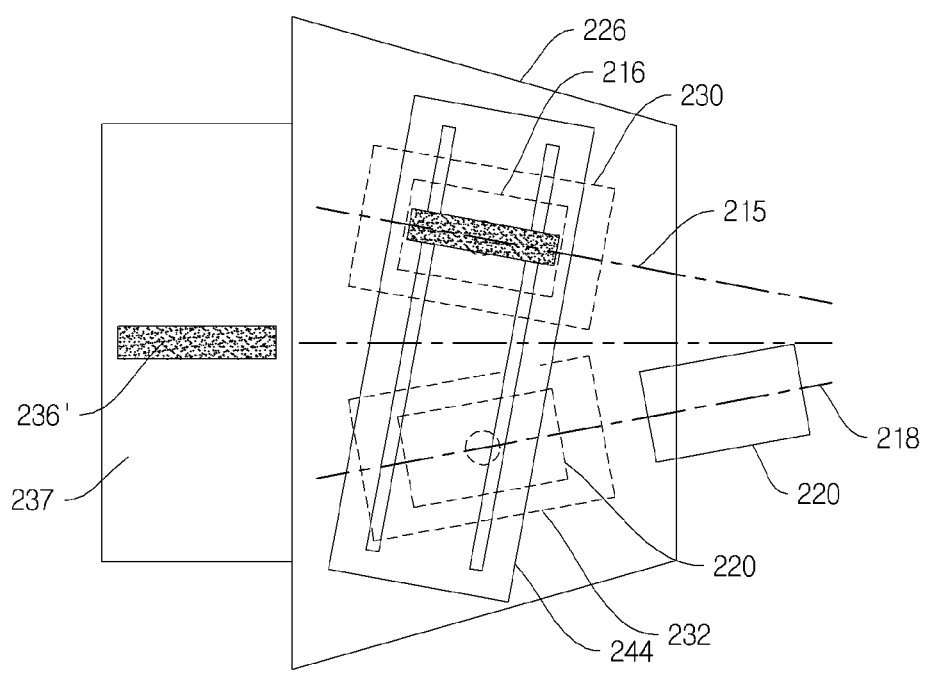

Then, as shown in FIG. 27, the organic material deposition source 236 is linearly moved to deposit the organic material particles on the first substrate 216 (S2300).

Since the organic material deposition source 236 is linearly moved in an opposite other side direction from one side of the first substrate 216 to deposit the organic material particles on the first substrate 216, the organic material deposition source 236 is linearly moved using the moving means. The deposition of the organic material on the first substrate 216 is carried out in a manner of deposing the organic material particles sublimated from the crucible by adding heat to the crucible of the organic material evaporation source 236 which contains the organic material.

After the organic material deposition source 236 reaches the other side of the first substrate 216, it is linearly moved in the opposite direction again to prepare for a progress of the deposition process of the second substrate 220.

Figure 28:
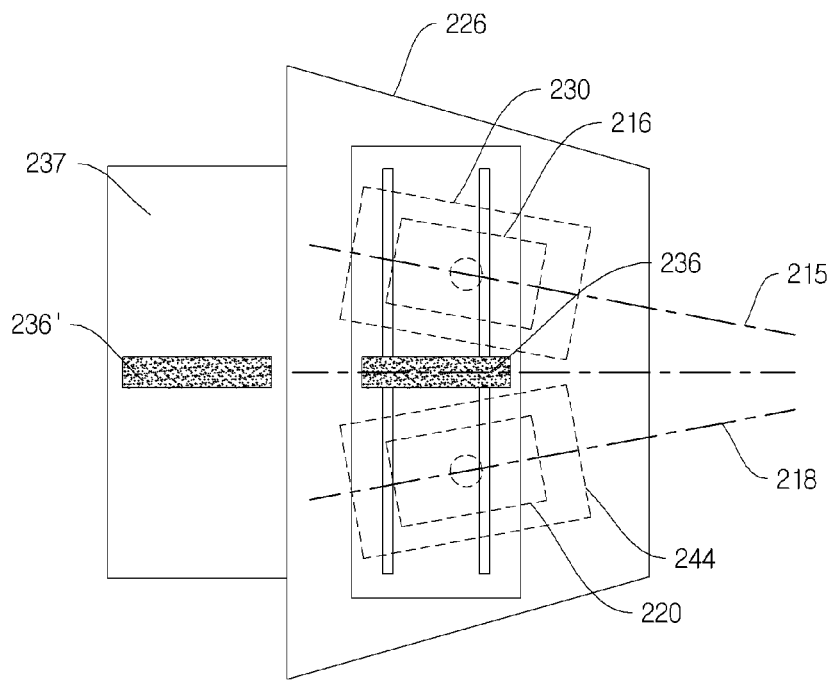

Then, as shown in FIGS. 27 and 28, the organic material particles are deposited on the first substrate 216, and at the same time, the second substrate 220 is loaded in the second radial direction 218 and is seated on the second substrate loading section 232 (S2400). It is possible to reduce the tact time by seating the second substrate 220 on the second substrate loading section 232 during the deposition process of the first substrate 216, and since loading of the second substrate 220 is performed during the deposition process of the first substrate 216, it is possible to reduce the loss of organic material.

In this process, when the second substrate 220 is seated on the second substrate loading section 232, the shadow mask is disposed on the surface of the second substrate 220, and the alignment between the second substrate 220 and the shadow mask is achieved.

In this embodiment, the meaning of "simultaneously" not only means that it is identical in view of time, but means that the deposition process of the first substrate 216 and the input process of the second substrate 220 are performed in an overlapped manner.

Figure 29:
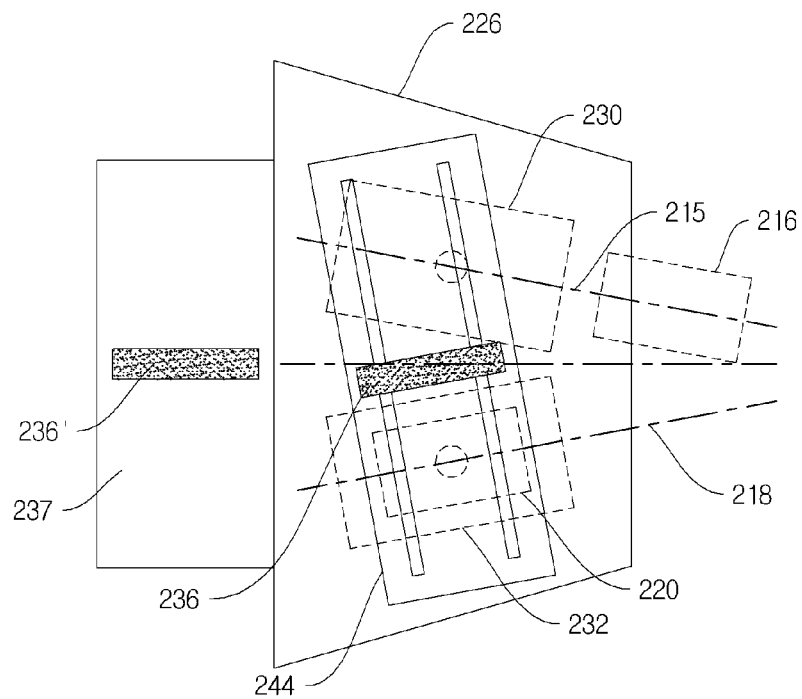

Moreover, as shown in FIG. 29, the moving means is rotated so that the linear organic material deposition source 236 is parallel to the one side of the second substrate 220 (S2500).

Like the process of rotating the first substrate 216, since the second substrate 220 is obliquely loaded into the main chamber 226 in second radial direction 218 and is seated on the second substrate loading section 232, in order to efficiently deposit the organic material on the second substrate 220 as the organic material deposition source 236 is moved linearly to face the surface of the substrate, the moving means is rotated so that the longitudinal direction of the organic material deposition source 236 is parallel to one side of the second substrate 220.

When the deposition of the first substrate 216 is completed, as illustrated in FIG. 29, the first substrate 216 subjected to the organic material deposition can be taken out of the main chamber 226 in the first radiation direction 215.

Figure 30:
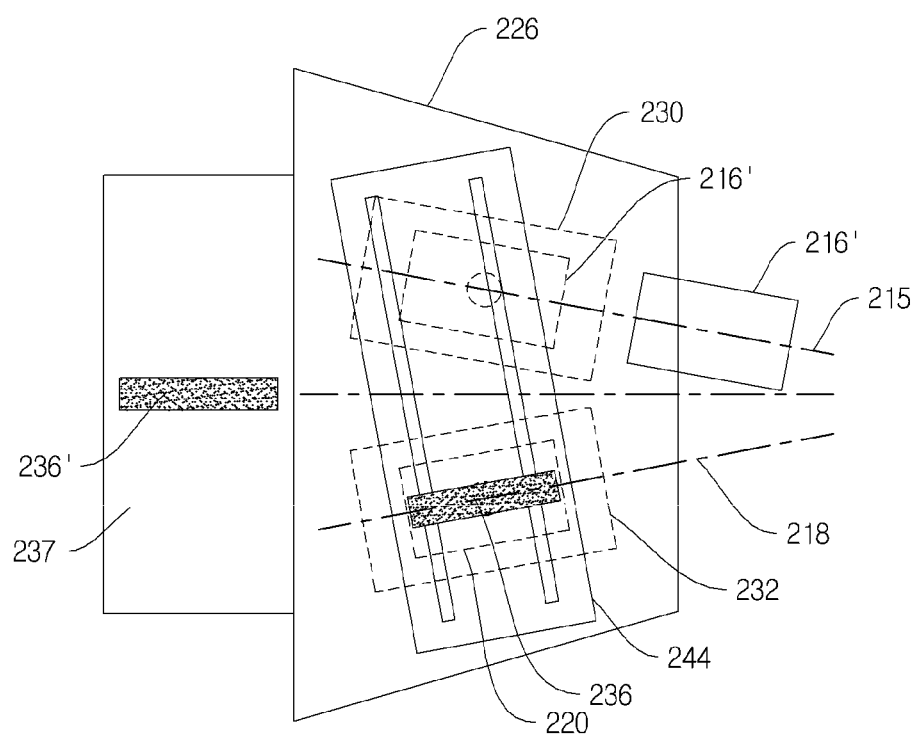

Moreover, as shown in FIG. 30, the organic material deposition source 236 is linearly moved to deposit the organic material particles on the second substrate 220 (S2600). Since the organic material deposition source 236 is linearly moved in the opposite other side direction from the one side of the second substrate 220 to deposit the organic material on the second substrate 220, the organic material deposition source 236 is linearly moved by using the moving means.

The organic material particles are deposited on the second substrate 220, and simultaneously, a new first substrate 216' can be loaded to and seated on the first substrate loading section 230 in the first radial direction 215. When the new first substrate 216' is seated on the first substrate loading section 230, it is aligned with the shadow mask to wait for the next deposition process.

Furthermore, when the deposition process of the second substrate 220 is completed, the second substrate 220 subjected to the organic material deposited is taken out of the main chamber 226 in the second radial direction 218, and a new second substrate is loaded to and seated on the second substrate loading section 232. When a new second substrate is seated on the second substrate loading section 232, it is aligned with the shadow mask to wait for the next deposition process.

When performing the deposition process of a plurality of substrates in a single chamber according to the above-described method, it is possible to reduce the tact time by performing the transport process or the alignment process of the other substrate during the deposition process of one substrate, and it is possible to reduce the loss of organic material which occurs during the transport process and the alignment process of the substrate.

On the other hand, the two organic material deposition sources 236, 236' form a pair, and the source chamber 237, which is opened and closed to the main chamber 226 each other and though which the organic material deposition sources 236, 236' are put into or taken out, can be coupled to the one side of the main chamber 226. In this case, the pair of organic material deposition sources 236, 236' can be disposed alternately with each other in the main chamber 226 and the source chamber 237. That is, when the organic material of the organic material deposition source 236 disposed in the main chamber 226 is exhausted, the organic material deposition source 236, in which the organic material of the organic material deposition source 236 disposed in the main chamber 226 is exhausted, is moved into the source chamber 237, and the other organic material deposition source 236' disposed in the source chamber 237 is directly moved into the main chamber 226. The organic material deposition source 236 in which the organic material in the source chamber 237 is exhausted is recharged with the organic material or replaced with a new organic material deposition source, and is prepared so as to be replaced immediately when the organic material of the organic material deposition source 236' in the main chamber 226 is exhausted.

In the above, it has been described with reference to specific embodiments of the present invention, if a person having ordinary skill in the art, without departing from the spirit and regions of the present invention described in the claims below within are not range, it will be understood that it can be variously modified and changed invention.

Many embodiments other than the previously described embodiment are present within the scope of the appended claims of the present invention.

While the present invention has been described in connection with the specific embodiments illustrated in the drawings, they are merely illustrative, and the invention is not limited to these embodiments. It is to be understood that various equivalent modifications and variations of the embodiments can be made by a person having an ordinary skill in the art without departing from the spirit and scope of the present invention. Therefore, the true technical scope of the present invention should not be defined by the above-mentioned embodiments but should be defined by the appended claims and equivalents thereof.

DESCRIPTION FOR REFERENCE NUMERALS 12, 112, 212: central point
14, 114, 214: robot arm
15, 215: first radiation direction
16, 16', 116, 116', 216, 216': first substrate
18, 218: second radiation direction
20, 120, 220: second substrate
22, 122: first deposition region
24, 124: second deposition region
26, 126, 226: main chamber
27, 136, 136', 236, 236': organic material deposition source
28: moving source means
29: rotating means
30, 130, 230: first substrate loading section
32, 132, 232: second substrate loading section
33: scanner
34: scanner moving means
36, 134, 234: shadow mask
38, 138, 238: blocking plate
39, 140, 240: partition wall
40, 43, 47: LM guide
41, 44, 52: moving block
42: scanner guide section
45: source guide section
46, 148, 248: moving table
48: boss
50: rotary shaft
51: support section
53: rotating section
54: rotation guide section
151: first radiation line segment
118: second radiation line segment
137: source chamber
142, 242: organic material guide
144, 244: moving means
146: horizontal guide section
150: vertical guide section
245: rotating means
246: linear guide section

What is claimed is:

1. An apparatus for depositing an organic material comprising:
a main chamber which is partitioned into a first deposition region and a second deposition region, a first substrate being put into and taken out of the first deposition region from one central point in a first radial direction, and a second substrate being put into and taken out of the second deposition region from the central point in a second radial direction;
a first substrate loading section in which the first substrate is loaded in the first radial direction and seated;
a second substrate loading section in which the second substrate is loaded in the second radial direction and seated;
a scanner which includes a linear organic material deposition source for injecting organic material particles, a source moving means to which the linear organic material deposition source is coupled to linearly move the linear organic material deposition source along a surface of the first substrate or the second substrate so that the organic material particles are injected onto the surface of the first substrate or the second substrate, and a rotating means for rotating the source moving means so that the linear organic material deposition source is parallel to one side of the first substrate or the second substrate; and
a scanner moving means for moving the scanner linearly so that the scanner is positioned in the first deposition region or the second deposition region,
wherein the source moving means includes:
a moving table which is disposed parallel to the first substrate or the second substrate as being rotated by the rotating means; and
a source guide section which is disposed at the moving table in a longitudinal direction so that the linear organic material deposition source moves in the longitudinal direction of the moving table.

2. The apparatus of claim 1, wherein the scanner moving means includes a pair of scanner guide sections which are arranged in parallel to each other across the first deposition region and the second deposition region and on which both ends of the moving table are supported respectively, and
the rotating means includes a rotation guide section which is coupled to one of the pair of scanner guide sections to guide the rotation of the moving table; and a moving section which is coupled to the remaining one of the pair of scanner guide sections and to which the moving table is rotatably coupled.

3. The apparatus of claim 1, further comprising:
a blocking plate which is disposed to face the surface of the first substrate or the second substrate to cover the first substrate or the second substrate.

4. The apparatus of claim 3, further comprising:
a partition wall which is coupled within the main chamber and is positioned between the first substrate loading section and the second substrate loading section.

5. A method for depositing an organic material using the apparatus of claim 1, the method comprising:
loading the first substrate in the first radial direction so as to be seated on the first substrate loading section;
moving the scanner to a first deposition region linearly by the scanner moving means;
rotating the source moving means by the rotating means of the scanner so that the linear organic material deposition source is parallel to one side of the first substrate, wherein the rotating comprises disposing the moving table parallel to the first substrate or the second substrate as the moving table is rotated by the rotating means and disposing the source guide section in the longitudinal direction of the moving table so that the linear organic material deposition source moves in the longitudinal direction;

linearly moving the linear organic material deposition source by the source moving means to deposit the organic material particles on the first substrate;

loading the second substrate in the second radial direction simultaneously with depositing the organic material particles on the first substrate so as to be seated on the second substrate loading section;

moving the scanner to the second deposition region linearly by the scanner moving means when deposition of the first substrate is completed;

rotating the source moving means by the scanner moving means so that the linear organic material deposition source is parallel with one side of the second substrate; and linearly moving the linear organic material deposition source by the source moving means to deposit the organic material particles on the second substrate.

6. The method of claim 5, further comprising:

after depositing the organic material particles on the first substrate, taking out the deposited first substrate from the main chamber, and loading a new first substrate in the first radial direction to be seated on the first substrate loading section.

7. The method of claim 5, further comprising:

after depositing the organic material particles on the second substrate, taking out the deposited second substrate from the main chamber, and loading a new second substrate in the second radial direction to be seated on the second substrate loading section.

8. An apparatus for depositing organic material comprising:

a main chamber which is partitioned into:
    a first deposition region which a first substrate is put into and taken out of in a first radial direction from one central point; and
    a second deposition region which a second substrate is put into and taken out of in a second radial direction from the one central point;

an organic material deposition source which is disposed within the main chamber, moves along a linear line to switch a position between the first deposition region and the second deposition region, and moves in a direction perpendicular to the linear line to inject organic material particles onto a surface of the first substrate or the second substrate;

a first substrate loading section which loads the first substrate and rotates the first substrate such that one side of the first substrate is parallel to the linear line;

a second substrate loading section which loads the second substrate and rotates the second substrate and rotates the second substrate such that one side of the second substrate is parallel to the linear line; and a source chamber which is coupled to one side of the main chamber, is opened and closed to the main chamber each other, and through which the organic material deposition source is put into and taken out, wherein two organic material deposition sources form a set, and wherein the two organic material deposition sources are arranged alternately each other in the main chamber and the source chamber.

9. The apparatus of claim 8, further comprising:

a vacuum pump which is connected to the source chamber and removes gas in the source chamber to have the same degree of vacuum as that of the main chamber.

10. The apparatus of claim 8, further comprising:

a blocking plate which is disposed to face the first substrate or the second substrate, and moves in a direction opposite to the organic material deposition source that moves along a movement line segment to cover the first substrate or the second substrate.

11. The apparatus of claim 10, further comprising:

a partition wall which is coupled within the main chamber to partition the first deposition region and the second deposition region.

12. The apparatus of claim 8, wherein the organic material deposition source includes an organic material guide which is coupled to an outer wall of the organic material deposition source so as to slide in the direction of the first substrate or the second substrate, and guides the organic material particles to the first substrate or the second substrate.

13. A method for depositing an organic material in a main chamber which is partitioned into a first deposition region where a first substrate is put into and taken out of one central point in a first radial direction and a second deposition region where a second substrate is put into and taken out of the central point in a second radial direction, the method comprising:

a first substrate input process of putting the first substrate into the first deposition region of the main chamber in the first radial direction;

a first substrate rotating process of rotating the first substrate so that one side of the first substrate is parallel to a linear line along which an organic material deposition source moves to switch a position between the first deposition region and the second deposition region;

a first substrate deposition process of moving the organic material deposition source along the linear line and moving the organic material deposition source in a direction perpendicular to the linear line so that the organic material deposition source deposits organic material particles on the first substrate;

a second substrate input process of putting the second substrate into the second deposition region of the main chamber in the second radial direction simultaneously with the first substrate deposition process;

a second substrate rotating process of rotating the second substrate so that one side of the second substrate is parallel to the linear line; and a second substrate deposition process of moving the organic material deposition source along the linear line and moving the organic material deposition source in the direction perpendicular to the linear line so that the organic material deposition source deposits the organic material particles on the second substrate, wherein the main chamber is coupled to a source chamber which is opened and closed to the main chamber, wherein the organic material deposition source is put into and taken out of the source chamber, and wherein a pair of organic material deposition sources including the organic material deposition sources are disposed alternately in the main chamber and the source chamber.

14. The method of claim 13, further comprising:

after the first substrate deposition process, a first substrate exchange process of taking the first substrate subjected to the first substrate deposition process out of the main chamber and putting a new first substrate into the first deposition region.

15. The method of claim 13, further comprising:

after the second substrate deposition process, a second substrate exchange process of taking the second substrate subjected to the second substrate deposition process out of the main chamber, and putting a new second substrate into the second deposition region of the main chamber.

16. An apparatus for depositing an organic material comprising:
a main chamber which a first substrate is put into and taken out of in a first radial direction from a central point, and which a second substrate is put into and taken out of in a second radial direction from the central point;
a first substrate loading section on which the first substrate is loaded in the first radial direction and seated;
a second substrate loading section on which the second substrate is loaded in the second radial direction and seated;
a linear organic material deposition source which injects organic material particles onto a surface of the first substrate or the second substrate;
a moving means for linearly moving the linear organic material deposition source so that the organic material particles are injected onto the surface of the first substrate or the second substrate;
a rotating means for rotating the moving means so that the linear organic material deposition source is parallel to one side of the first substrate or the second substrate; and
a source chamber which is coupled to one side of the main chamber and is opened and closed to the main chamber,
wherein the linear organic material deposition source is put into and taken out of the source chamber, and
wherein a pair of linear organic material deposition sources including the linear organic material deposition source are disposed alternately in the main chamber and the source chamber.

17. The apparatus of claim 16, further comprising:
a vacuum pump which is connected to the source chamber to remove gas in the source chamber so as to have the same degree of vacuum as that of the main chamber.

18. The apparatus of claim 16, further comprising:
a blocking plate which is disposed to face the surface of the first substrate or the second substrate and covers the first substrate or the second substrate.

19. The apparatus of claim 18, further comprising:
a partition wall which is coupled into the main chamber and is positioned between the first substrate loading section and the second substrate loading section.

20. The apparatus of claim 16, wherein the linear organic material deposition source includes an organic material guide which is coupled to an outer wall of the linear organic material deposition source so as to slide in the direction of the first substrate or the second substrate, and guides the organic material particles to the first substrate or the second substrate.

21. A method for depositing an organic material using the apparatus of claim 16, the method comprising:
loading the first substrate in the first radiation direction to be seated on the first substrate loading section;
rotating the moving means so that the linear organic material deposition source is parallel to one side of the first substrate;
linearly moving the linear organic material deposition source to deposit organic material particles on the first substrate;
loading the second substrate in the second radial direction so as to be seated on the second substrate loading section simultaneously with depositing the organic material particles on the first substrate;
rotating the moving means so that the linear organic material deposition source is parallel to one side of the second substrate;
linearly moving the linear organic material deposition source to deposit the organic material particles on the second substrate; and
alternately disposing a pair of the organic material deposition sources including the linear organic material deposition source in the main chamber and a source chamber coupled to one side of the main chamber,
wherein the source chamber is opened and closed to the main chamber, and
wherein the organic material deposition source is put into and taken out of the source chamber.

22. The method of claim 21, further comprising,
after depositing the organic material particles on the first substrate,
taking out the first substrate from the main chamber after depositing the organic material particles on the first substrate, and loading a new first substrate in the first radial direction so as to be seated on the first substrate loading section.

23. The method of claim 21, further comprising,
after depositing the organic material particles on the second substrate,
taking out the second substrate from the main chamber, and loading a new second substrate in the second radiation direction so as to be seated on the second substrate loading section.

* * * * *